(12) United States Patent
Tsutsumi

(10) Patent No.: US 9,136,817 B2
(45) Date of Patent: Sep. 15, 2015

(54) FILTER MODULE AND DUPLEXER MODULE

(71) Applicant: TAIYO YUDEN CO., LTD., Tokyo (JP)

(72) Inventor: Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 141 days.

(21) Appl. No.: 13/912,991

(22) Filed: Jun. 7, 2013

(65) Prior Publication Data

US 2013/0328640 A1 Dec. 12, 2013

(30) Foreign Application Priority Data

Jun. 12, 2012 (JP) ................. 2012-132611

(51) Int. Cl.
*H01L 41/00* (2013.01)
*H03H 9/00* (2006.01)
*H03H 7/46* (2006.01)
*H03H 9/70* (2006.01)
*H03H 9/05* (2006.01)
*H03H 9/72* (2006.01)

(52) U.S. Cl.
CPC ............. *H03H 7/463* (2013.01); *H03H 9/0566* (2013.01); *H03H 9/70* (2013.01); *H03H 9/706* (2013.01); *H03H 9/725* (2013.01)

(58) Field of Classification Search
CPC ........ H03H 9/725; H03H 9/706; H03H 7/463
USPC ......................................................... 333/133
See application file for complete search history.

(56) References Cited

U.S. PATENT DOCUMENTS

| 6,380,823 | B1 | 4/2002 | Ikata et al. | |
|---|---|---|---|---|
| 2005/0104685 | A1* | 5/2005 | Kuroki et al. | 333/133 |
| 2006/0132260 | A1* | 6/2006 | Iwamoto et al. | 333/133 |
| 2010/0117762 | A1* | 5/2010 | Taniguchi et al. | 333/187 |

FOREIGN PATENT DOCUMENTS

| JP | 2000-349586 A | 12/2000 |
|---|---|---|
| JP | 2010-45563 A | 2/2010 |

\* cited by examiner

*Primary Examiner* — Sibin Chen
*Assistant Examiner* — Metasebia Retebo
(74) *Attorney, Agent, or Firm* — Chen Yoshimura LLP

(57) ABSTRACT

A filter module includes: reception filters connected between an antenna terminal and a reception terminal; and a module substrate, wherein a first reception filter that is at least one reception filter of the reception filters is embedded in the module substrate, and a second reception filter that is at least another one reception filter is mounted on a surface of the module substrate so as to overlap the first reception filter.

12 Claims, 29 Drawing Sheets

FILTER MODULE AND DUPLEXER MODULE

CROSS-REFERENCE TO RELATED APPLICATION

This application is based upon and claims the benefit of priority of the prior Japanese Patent Application No. 2012-132611, filed on Jun. 12, 2012, the entire contents of which are incorporated herein by reference.

FIELD

A certain aspect of the present invention relates to a filter module and a duplexer module.

BACKGROUND

Wireless communication devices typified by mobile phone terminals have been modified into multiband systems, and multiple wireless devices have been installed in one wireless communication device. For example, there has been known a mobile phone terminal supporting multiple frequency bands, and multiple reception filters and multiple duplexers are installed in the mobile phone terminal.

There has been known a module including two duplexers configured so that a reception terminal to be electrically coupled to a low noise amplifier (hereinafter, referred to as LNA) is switched between the reception terminals of the two duplexers by an external switch (e.g. Japanese Patent Application Publication No. 2000-349586). Also, there has been known a module including two duplexers configured so that antenna terminals of the two duplexers are unified (e.g. Japanese Patent Application Publication No. 2010-45563).

The mobile phone terminal supporting multiple frequency bands includes large numbers of reception filters and duplexers, and thereby the number of reception filters increases and wiring arrangement becomes complicated. In recent years, use of a differential circuit has increased to form a reception circuit in an RF transceiver IC (radio frequency transceiver integrated circuit) to which a reception filter and a reception terminal of a duplexer are coupled. In this case, two reception filters and two reception terminals of the duplexer are provided with respect to one reception band, and thus the wiring arrangement becomes further complicated. In addition, increase in numbers of reception filters and duplexers causes a filter module in which the reception filters are installed and a duplexer module in which the duplexers are installed to grow in size.

Moreover, an LTE (Long Term Evolution) system has recently started, and thus the number of frequency bands to be supported by one mobile phone terminal further increases because the LTE method often uses a unique frequency band. Therefore, reception filters and duplexers further increase, and thereby the wiring arrangement becomes further complicated and the filter module and the duplexer module further grow in size.

The above problems may be solved by configuring the reception filter and the duplexer to be tunable. However, when an acoustic wave filter is used for the reception filter and the duplexer, they are difficult to be configured to be tunable.

SUMMARY OF THE INVENTION

According to an aspect of the present invention, there is provided a filter module including: reception filters connected between an antenna terminal and a reception terminal; and a module substrate, wherein a first reception filter that is at least one reception filter of the reception filters is embedded in the module substrate, and a second reception filter that is at least another one reception filter is mounted on a surface of the module substrate so as to overlap the first reception filter.

According to another aspect of the present invention, there is provided a duplexer module including: the above described filter module.

DETAILED DESCRIPTION

A description will first be given of a comparative example using a wireless device unit of a mobile phone terminal supporting four frequency bands as an example. Four frequency bands may be band 1, band 2, band 5, and band 8 of W-CDMA (Wideband Code Division Multiple Access). Table 1 lists a transmission band and a reception band of each band.

TABLE 1

| BAND | TRANSMISSION BAND [MHz] | RECEPTION BAND [MHz] |
| --- | --- | --- |
| 1 | 1920-1980 | 2110-2170 |
| 2 | 1850-1910 | 1930-1990 |
| 5 | 824-849 | 869-894 |
| 8 | 880-915 | 925-960 |

Figure 1:
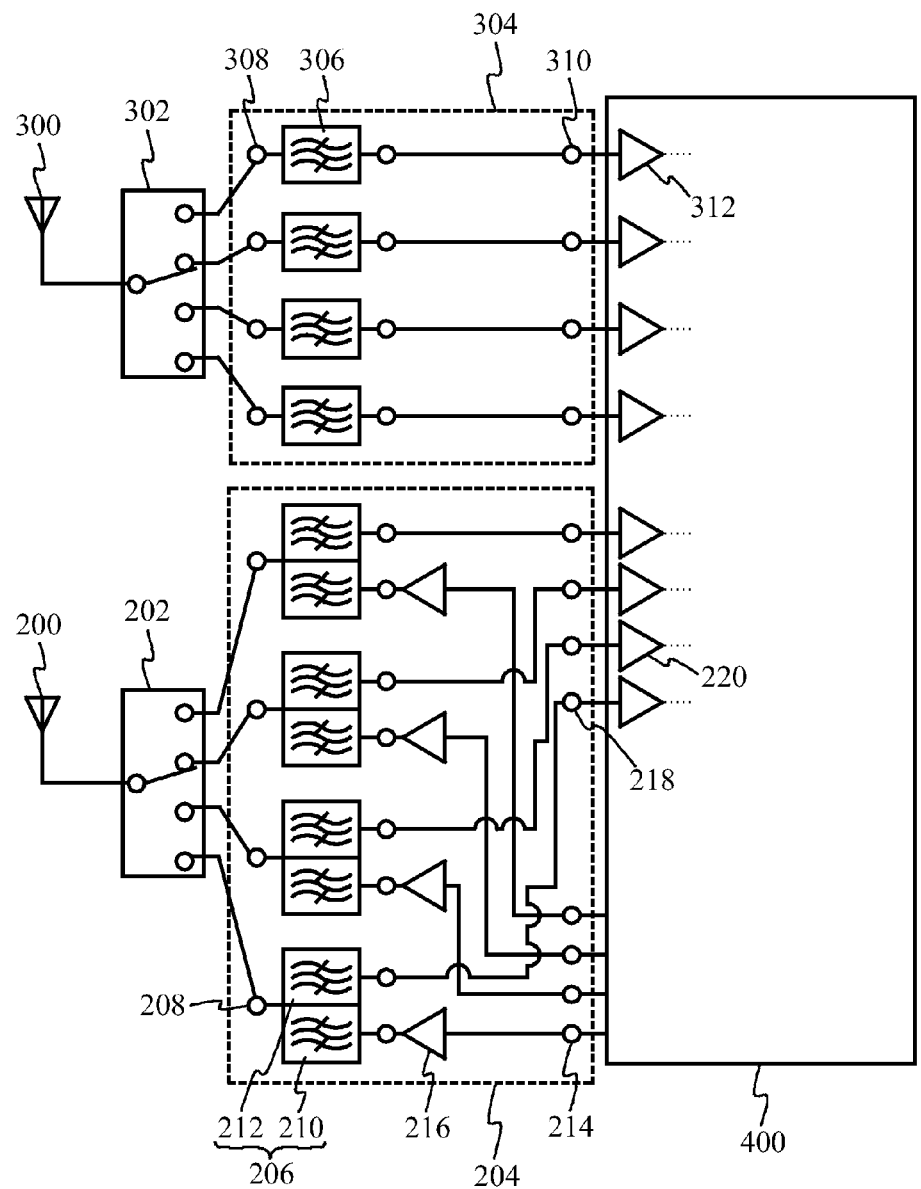
FIG. 1 is a circuit diagram illustrating a wireless device unit of a mobile phone terminal in accordance with a first comparative example.

FIG. 1 is a circuit diagram illustrating a wireless device unit of a mobile phone terminal in accordance with a first comparative example. As illustrated in FIG. 1, the wireless device unit of the mobile phone terminal of the first comparative example includes a main antenna 200 and a reception diversity antenna 300 that complements the main antenna 200. A duplexer module 204 is coupled to the main antenna 200 through an antenna switch 202. A filter module 304 is coupled to the reception diversity antenna 300 through an antenna switch 302.

The duplexer module 204 includes four duplexers 206 in order to support four frequency bands. Antenna terminals 208 of the duplexers 206 are coupled to the antenna switch 202. This configuration allows the antenna switch 202 to select a duplexer to be electrically connected to the main antenna 200 from the four duplexers 206.

Each of the duplexers 206 includes a transmission filter 210 and a reception filter 212. The transmission filters 210 of the four duplexers 206 are coupled to an RF transceiver IC 400 through transmission terminals 214. Power amplifiers 216 are coupled between the transmission filters 210 and the transmission terminals 214. The reception filters 212 of the four duplexers 206 are coupled to LNAs 220 in the RF transceiver IC 400 through reception terminals 218.

The filter module 304 includes four reception filters 306 in order to support four frequency bands. Antenna terminals 308 of the four reception filters 306 are coupled to the antenna switch 302. This configuration allows the antenna switch 302 to select a reception filter to be electrically coupled to the reception diversity antenna 300 from the four reception filters 306. The four reception filters 306 are coupled to LNAs 312 in the RF transceiver IC 400 through reception terminals 310.

In the first comparative example, the duplexer module 204 includes the four duplexers 206, and the antenna terminals 208, transmission terminals 214, and reception terminals 218 coupled to respective duplexers 206 in order to support four frequency bands. Thus, wirings increases and the wiring arrangement becomes complicated. In addition, the duplexer module 204 grows in size because it includes the four duplexers 206. Likewise, the filter module 304 includes the four reception filters 306, and the antenna terminals 308 and reception terminals 310 coupled to respective reception filters 306. Thus, the wiring arrangement becomes complicated and the filter module 304 grows in size.

Figure 2:
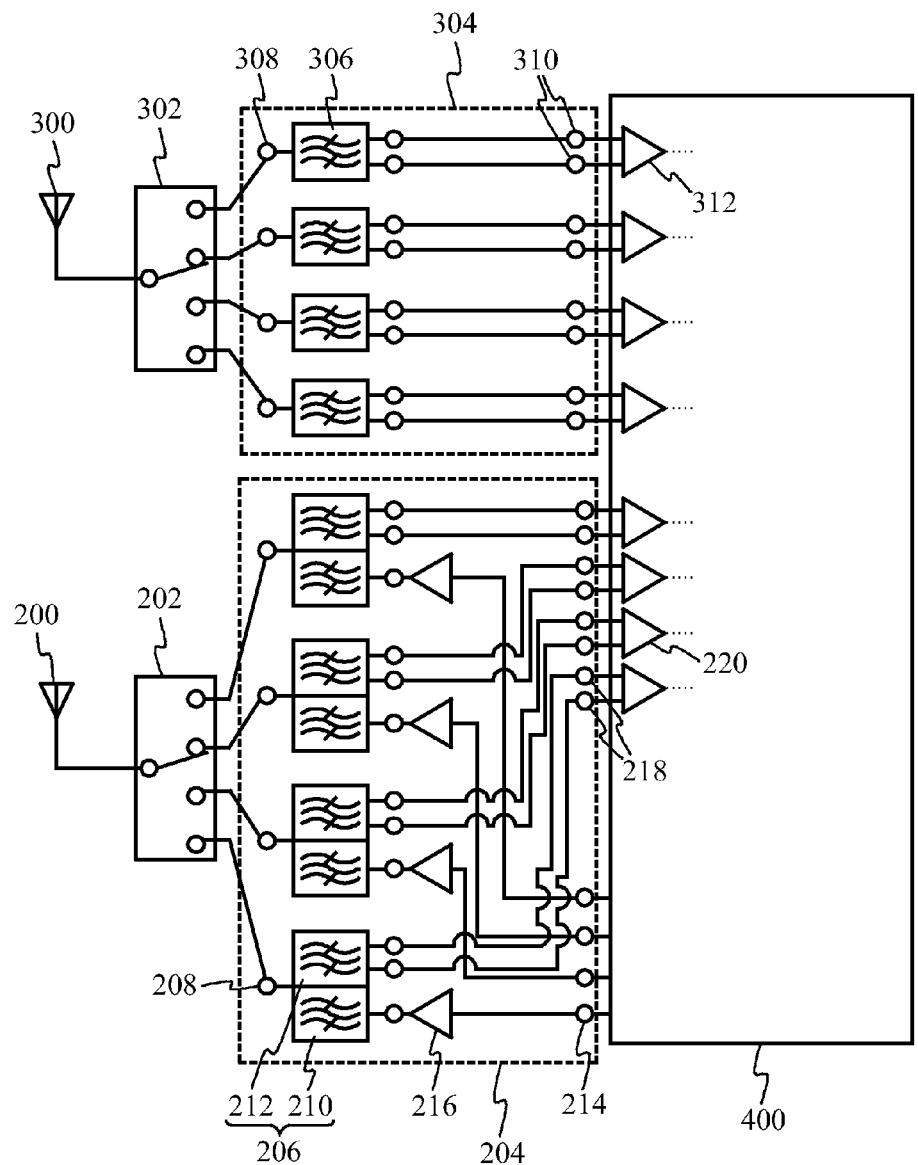
FIG. 2 is a circuit diagram illustrating a wireless device unit of a mobile phone terminal in accordance with a second comparative example.

A description will next be given of a wireless device unit of a mobile phone terminal using an RF transceiver IC of which a reception circuit is formed by a differential circuit. FIG. 2 is a circuit diagram illustrating a wireless device unit of a mobile phone terminal in accordance with a second comparative example. As illustrated in FIG. 2, a differential filter is used for the reception filters 212 of the duplexers 206. Thus, two reception terminals 218 are connected to each of the reception filters 212. Likewise, a differential filter is used for the reception filters 306, and two reception terminals 310 are coupled to each of the reception filters 306.

When a differential filter is used for a reception filter as described in the second comparative example, the number of reception terminals doubles, and the wiring arrangement becomes further complicated.

Thus, hereinafter, a description will be given of embodiments capable of making wiring arrangement less complicated and reducing the size by reducing the number of reception terminals without reducing the number of frequency bands to be supported.

First Embodiment

Figure 3:
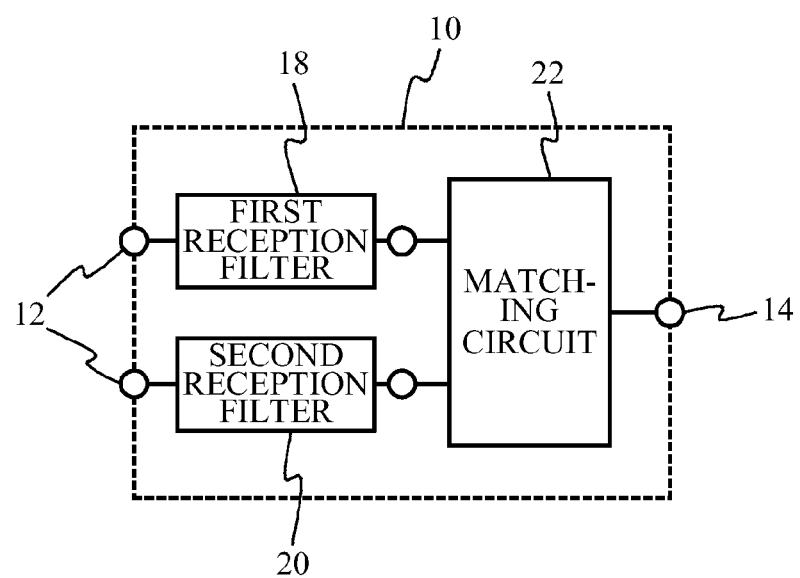
FIG. 3 is a block diagram illustrating a filter module in accordance with a first embodiment.

A first embodiment is an exemplary filter module supporting two frequency bands. FIG. 3 is a block diagram illustrating a filter module in accordance with the first embodiment. As illustrated in FIG. 3, a filter module 10 of the first embodiment includes a first reception filter 18, a second reception filter 20, and a matching circuit 22 connected between antenna terminals 12 and a reception terminal 14. The first reception filter 18 is a bandpass filter for a first frequency band. The second reception filter 20 is a bandpass filter for a second frequency band different from the first frequency band. The matching circuit 22 is coupled to the first reception filter 18 and the second reception filter 20. The first reception filter 18 and the second reception filter 20 are connected to respective antenna terminals 12. Reception terminals of the first reception filter 18 and the second reception filter 20 are unified through the matching circuit 22, and forms one reception terminal 14.

Here, a description will be given of a function of the matching circuit. The matching circuit 22 is a passive circuit that matches an impedance of the first reception filter 18 with an impedance of the reception terminal 14 and significantly increases an impedance of the second reception filter 20 in the first frequency band. In addition, the matching circuit 22 is a passive circuit that significantly increases an impedance of the first reception filter 18 and matches an impedance of the second reception filter 20 with an impedance of the reception terminal 14 in the second frequency band. Thus, the matching circuit 22 makes the second frequency band, which is the reception band of the second reception filter 20, suppressed when passing signals in the first frequency band that is the reception band of the first reception filter 18. Moreover, the matching circuit 22 makes the first frequency band, which is the reception band of the first reception filter 18, suppressed when passing signals in the second frequency band that is the reception band of the second reception filter 20. This configuration allows switching a reception filter to be electrically connected to the unified reception terminal 14 between the first reception filter 18 and the second reception filter 20.

Figure 4:
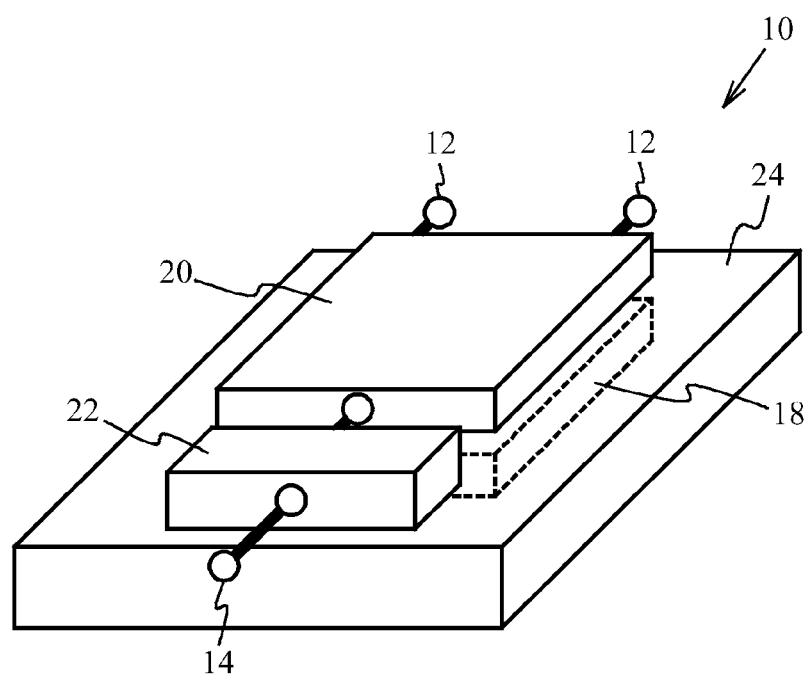
FIG. 4 is a perspective view of the filter module in accordance with the first embodiment.

FIG. 4 is a perspective view illustrating the filter module in accordance with the first embodiment. As illustrated in FIG. 4, the filter module 10 of the first embodiment is configured so that the first reception filter 18 is embedded in a module substrate 24 and the second reception filter 20 is mounted on a surface of the module substrate 24. The first reception filter 18 and the second reception filter 20 are located so as to overlap each other. The first reception filter 18 and the second reception filter 20 are wafer level packages including a sealing portion that is formed on a substrate including an electrode exciting an acoustic wave formed therein to seal the electrode exciting the acoustic wave, or packages including a sealing portion that is formed on a wiring substrate in which a substrate with an electrode exciting an acoustic wave formed therein is installed to seal the substrate. The matching circuit 22 is located on the surface of the module substrate 24. The module substrate 24 is a multilayered substrate formed by stacking an insulating layer made of resin such as an epoxy resin and a wiring layer made of metal formed thereon.

The filter module 10 of the first embodiment includes the first reception filter 18 for the first frequency band, the second reception filter 20 for the second frequency band, and the matching circuit 22 that is coupled to the first reception filter 18 and the second reception filter 20 and makes one of the first frequency band and the second frequency band suppressed when passing signals in the other one. This configuration allows the matching circuit 22 to switch a reception filter to be electrically coupled to the reception terminal 14 in accordance with the frequency band, and the reception terminals of the first reception filter 18 and the second reception filter 20 to be unified through the matching circuit 22. Therefore, the number of reception terminals can be reduced without reducing the number of frequency bands to be supported, and thus, the wiring arrangement can be less complicated. The wiring arrangement may be less complicated not only between the first reception filter 18 and second reception filter 20 and the reception terminal 14, but also between the reception terminal 14 and LNAs subsequently coupled. For example, when one LNA supporting the first frequency band and the second frequency band is coupled to the unified reception terminal 14, the wiring between the reception terminal 14 and the LNA can be made single, and the wiring arrangement can become less complicated. The LNA is located in the RF transceiver IC as illustrated in FIG. 1, and thus the number of input terminals of the RF transceiver IC can be also reduced.

In addition, the first reception filter 18 is embedded in the module substrate 24 and the second reception filter 20 is mounted on the surface of the module substrate 24 so that the first reception filter 18 and the second reception filter 20 are located so as to overlap each other. This configuration reduces the size of the filter module 10 compared to mounting both the first reception filter 18 and the second reception filter 20 on the surface of the module substrate 24.

The size of the filter module 10 can be reduced if the first reception filter 18 and the second reception filter 20 are arranged so as to overlap each other in at least a part thereof. However, to reduce the size of the filter module 10, preferably a half or more of areas of the first reception filter 18 and the second reception filter 20 overlap each other, more preferably three quarters or more of areas overlap each other, and further preferably all areas overlap each other. For example, a projected region of one of the first reception filter 18 and the second reception filter 20 is preferably included in a region of the other one.

A reception signal is weak, and thus noise reduction is required. The first embodiment can decrease the wirings through which the reception signal propagates, and thus the reception signal does not get a noise easily. That is to say, a noise included in the reception signal can be reduced by unifying the reception terminals of the first reception filter 18 and the second reception filter 20 through the matching circuit 22. A low-loss switch for the antenna terminals 12 is already achieved, and a reception filter to be electrically coupled to the antenna can be switched by the antenna switch, and thus the unification is not performed. In addition, the matching circuit 22 is a passive circuit, and thus it is not necessary to newly provide a control terminal.

Second Embodiment

Figure 5:
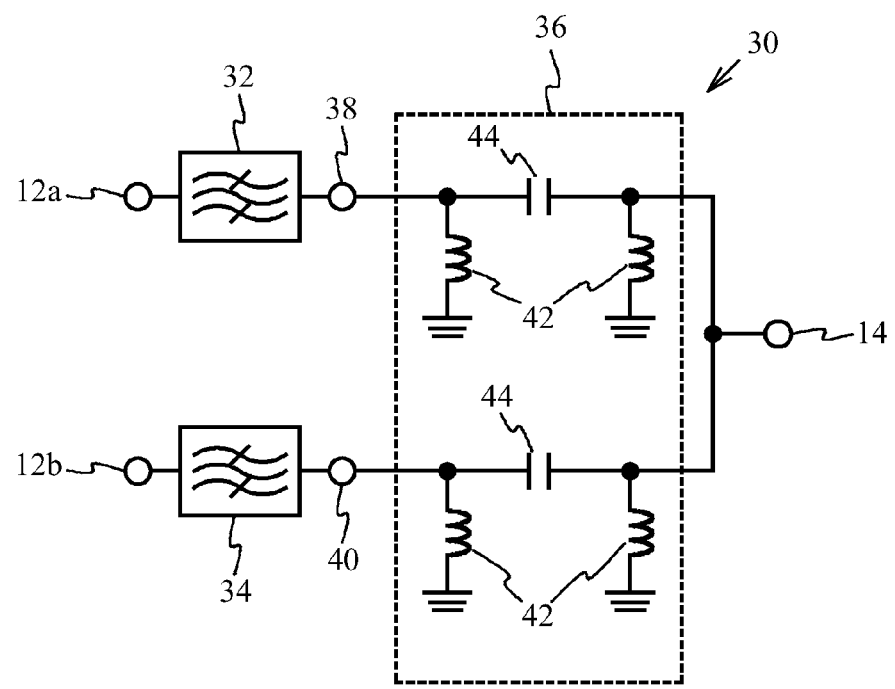
FIG. 5 is a circuit diagram illustrating a filter module in accordance with a second embodiment.

A second embodiment is an exemplary filter module including a reception filter supporting band 1 of W-CDMA and a reception filter supporting band 2. FIG. 5 is a circuit diagram illustrating a filter module in accordance with the second embodiment. As illustrated in FIG. 5, a filter module 30 of the second embodiment includes a first reception filter 32 supporting band 1, a second reception filter 34 supporting band 2, and a matching circuit 36 coupled to the first reception filter 32 and the second reception filter 34. Antenna terminals are separately provided for band 1 and band 2, and the first reception filter 32 is coupled to an antenna terminal 12a for band 1, and second reception filter 34 is coupled to an antenna terminal 12b for band 2. The first reception filter 32 and the second reception filter 34 are coupled to the matching circuit 36 through terminals 38 and 40 respectively, and reception terminals of the reception filters are unified through the matching circuit 36 and forms one reception terminal 14.

The matching circuit 36 has the same function as that of the matching circuit 22 described in the first embodiment. The matching circuit 36 includes inductors 42 and capacitors 44. The inductors 42 are connected in parallel to the first reception filter 32 between a node, which is between the first reception filter 32 and the reception terminal 14, and a ground, and the inductors 42 are connected in parallel to the second reception filter 34 between a node, which is between the second reception filter 34 and the reception terminal 14, and a ground. The capacitors 44 are connected in series between the first reception filter 32 and the reception terminal 14 and between the second reception filter 34 and the reception terminal 14.

Figure 6A:
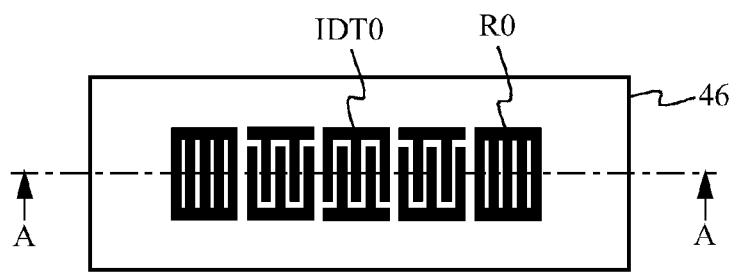
FIG. 6A is a plan view illustrating a first reception filter and a second reception filter.
Figure 6B:
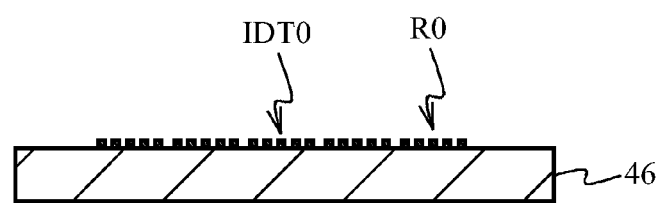
FIG. 6B is a cross-sectional view taken along line A-A in FIG. 6A.

FIG. 6A is a plan view illustrating the first reception filter 32 and the second reception filter 34, and FIG. 6B is a cross-sectional view taken along line A-A in FIG. 6A. As illustrated in FIG. 6A and FIG. 6B, each of the first reception filter 32 and the second reception filter 34 includes three IDTs (Interdigital Transducer) IDT0 arranged in a propagation direction of an acoustic wave on a piezoelectric substrate 46 such as a lithium tantalate substrate (LT substrate) and reflectors R0 located at both sides thereof. As illustrated, the first reception filter 32 and the second reception filter 34 are surface acoustic wave filters of double mode coupling type. The IDT0 and reflectors R0 are formed of metal such as Al (aluminum).

The second embodiment designs the antenna terminals 12a and 12b to have an impedance of 50Ω, and the reception terminal 14 to have an impedance of 100Ω. The inductors 42 connected between the first reception filter 32 and the reception terminal 14 are designed to have an inductance of 42 nH and a Q-value of 40 at 2 GHz, and the capacitor 44 connected between the first reception filter 32 and the reception terminal 14 is designed to have a capacitance of 3 pF and a Q-value of 100 at 2 GHz. The inductors 42 connected between the second reception filter 34 and the reception terminal 14 are designed to have an inductance of 33 nH and a Q-value of 40 at 2 GHz, and the capacitor 44 connected between the second reception filter 34 and the reception terminal 14 is designed to have a capacitance of 1 pF and a Q-value of 100 at 2 GHz.

Figure 7:
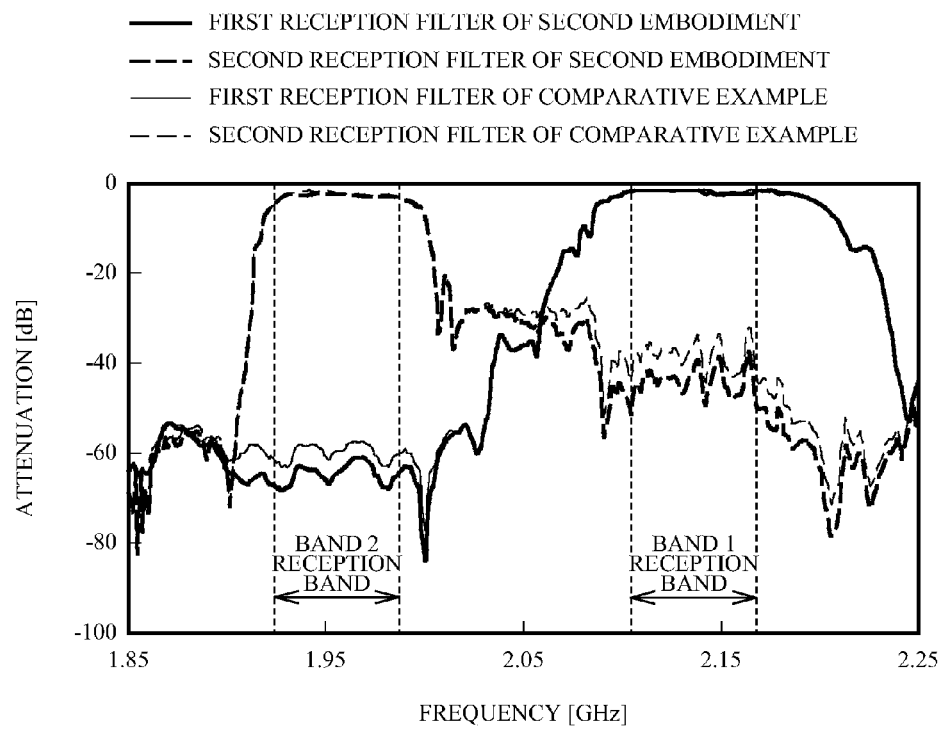
FIG. 7 is a diagram illustrating pass characteristics of the filter module in accordance with the second embodiment.
Figure 8:
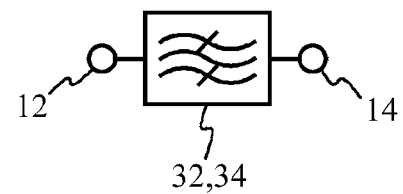
FIG. 8 is a circuit diagram illustrating a configuration for separately measuring the pass characteristics of the first reception filter and the second reception filter alone.

FIG. 7 is a diagram illustrating pass characteristics of the filter module in accordance with the second embodiment. In FIG. 7, a bold solid line indicates a pass characteristic of the first reception filter 32 included in the filter module 30 of the second embodiment, and a bold dashed line indicates a pass characteristic of the second reception filter 34. In addition, as a comparative example, a thin solid line indicates a pass characteristic of the first reception filter 32 separately measured alone, and a thin dashed line indicates a pass characteristic of the second reception filter 34 separately measured alone. The pass characteristics of the first reception filter 32 and the second reception filter 34 separately measured alone are pass characteristics measured in a state where the first reception filter 32 or the second reception filter 34 is connected alone between the antenna terminal 12 and the reception terminal 14 as illustrated in FIG. 8.

As illustrated in FIG. 7, the first reception filter 32 and the second reception filter 34 of the second embodiment exhibit good filter characteristics approximately same as the pass characteristics of the comparative example. The attenuation in the suppression range is improved in the first reception filter 32 and the second reception filter 34 of the second embodiment compared to the comparative example. As described above, the attenuation in the suppression range is improved by unifying the reception terminals through the matching circuit.

Figure 9:
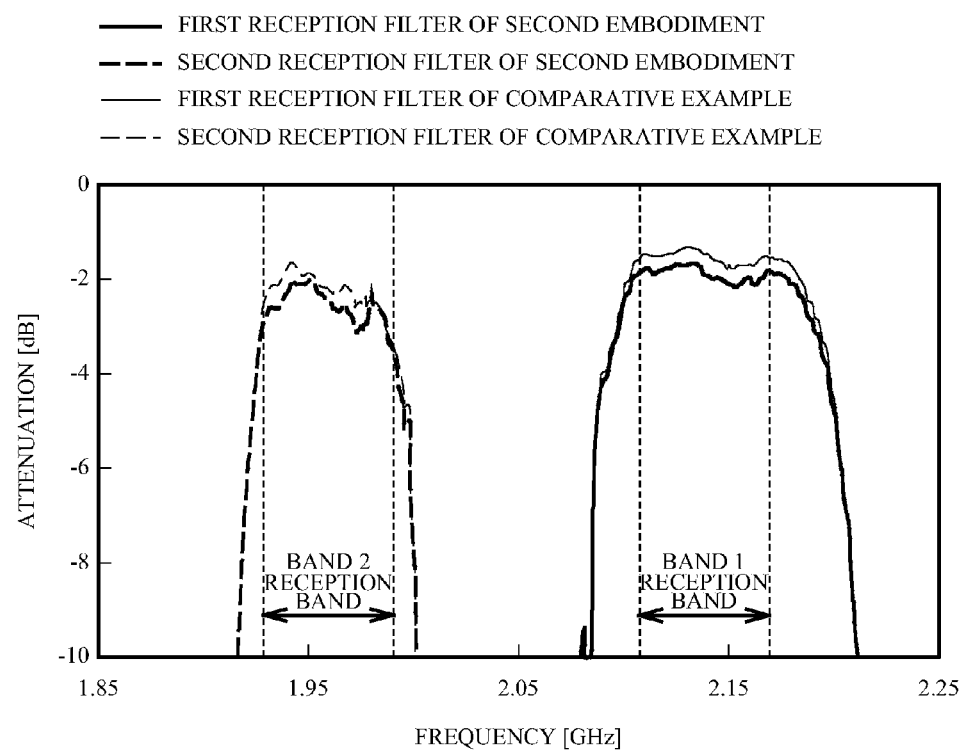
FIG. 9 is an enlarged view around reception bands in FIG. 7.

FIG. 9 is an enlarged view around the reception bands in FIG. 7. As illustrated in FIG. 9, an insertion loss increases by approximately 0.3 dB in the first reception filter 32 and the second reception filter 34 of the second embodiment compared to the comparative example. This increase is considered due to the Q-value of the matching circuit 36, and thus will be improved by a matching circuit with a high Q-value. Moreover, the attenuation in the suppression range is expected to be improved by unifying the reception terminals through the matching circuit as illustrated in FIG. 7, and thus the increase in loss can be canceled out by designing a filter to preliminarily have a low attenuation and low-loss.

Figure 10:
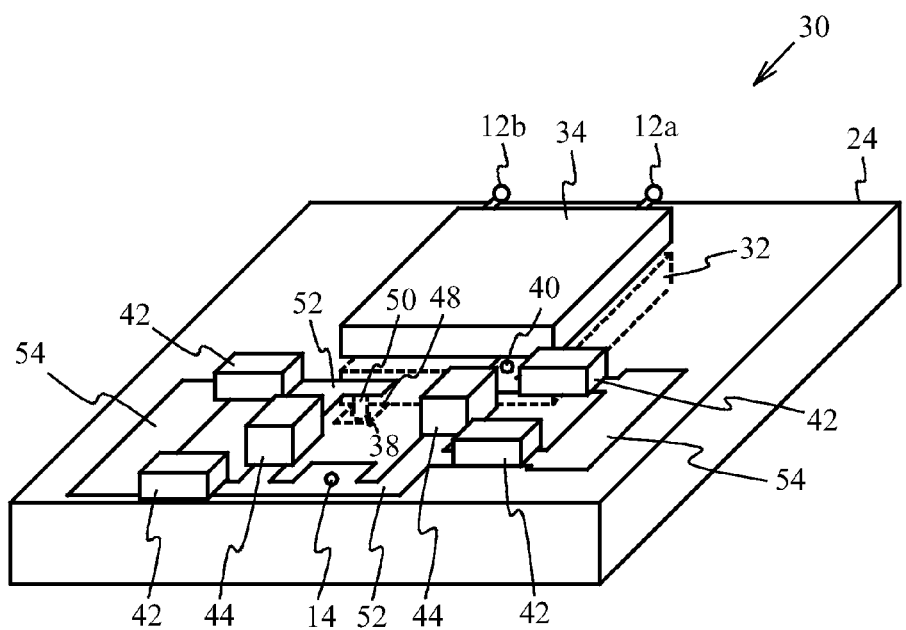
FIG. 10 is a perspective view illustrating a filter module in accordance with the second embodiment.

FIG. 10 is a perspective view illustrating a filter module in accordance with a second embodiment. As illustrated in FIG. 10, the filter module 30 of the second embodiment is configured so that the first reception filter 32 is embedded in the module substrate 24 and the second reception filter 34 is mounted on the surface of the module substrate 24. The first reception filter 32 and the second reception filter 34 are located so as to overlap each other in most parts thereof. The first reception filter 32 and the second reception filter 34 are wafer level packages including a sealing portion that is formed on a substrate including an electrode exciting an acoustic wave formed therein to seal the electrode exciting the acoustic wave, or packages including a sealing portion that is formed on a wiring substrate in which a substrate with an electrode exciting an acoustic wave formed therein is installed to seal the substrate. The inductors 42 and capacitors 44 constituting the matching circuit 36 are mounted on the surface of the module substrate 24. The module substrate 24 is a multilayered substrate formed by stacking a metal wiring layer and an insulating layer such as resin.

The terminal 38 to which the first reception filter 32 is coupled is coupled to a wiring 48 embedded in the module substrate 24. The wiring 48 is electrically coupled to a wiring 52 formed on the surface of the module substrate 24 by a penetrating electrode 50. The terminal 40 to which the second reception filter 34 is coupled is coupled to the wiring 52 formed on the module substrate 24. The wiring 52 to which the first reception filter 32 is electrically coupled and the wiring 52 to which the second reception filter 34 is electrically coupled are connected to be unified, and coupled to the reception terminal 14. This configuration allows the reception terminals of the first reception filter 32 and the second reception filter 34 to be unified to form the reception terminal 14. The wirings 52 include a branch point, and the inductors 42 are connected between the branch points and ground wirings 54. The capacitors 44 are connected in series between the reception terminal 14 and the first reception filter 32 and between the reception terminal 14 and the second reception filter 34.

The second embodiment configures the reception terminals of the first reception filter 32 and the second reception filter 34 to be unified through the matching circuit 36 to form one reception terminal 14 as illustrated in FIG. 5. Therefore, the number of reception terminals can be reduced without reducing the number of frequency bands to be supported, and thus the wiring arrangement can be less complicated. In addition, as described in FIG. 7, the attenuation in the suppression ranges of the first reception filter 32 and the second reception filter 34 can be improved by unifying the reception terminals of the first reception filter 32 and the second reception filter 34 through the matching circuit 36. Further, as illustrated in FIG. 10, the first reception filter 32 is embedded in the module substrate 24, the second reception filter 34 is mounted on the surface of the module substrate 24, and the first reception filter 32 and the second reception filter 34 are located so as to overlap each other. Thereby, the filter module 30 can be downsized.

As illustrated in FIG. 5, the matching circuit 36 preferably includes the inductor 42 connected between a node, which is between the first reception filter 32 and the reception terminal 14, and a ground, and the inductor 42 connected between a node, which is between the second reception filter 34 and the reception terminal 14, and a ground. This configuration can reduce the increase in loss of the first reception filter 32 and the second reception filter 34 due to addition of the matching circuit 36 because the inductor with a large resistance component is used as a parallel element. When the inductor 42 is embedded in the module substrate 24, the inductor 42 comes close to the wiring because a large number of wirings are located in the module substrate 24, and thus an eddy current is generated and a change in inductance and degradation of Q-value are caused. Therefore, to avoid the above described circumstances, the inductors 42 constituting the matching circuit 36 are preferably located on the surface of the module substrate 24 as illustrated in FIG. 10. This configuration can suppress the performance degradation of the inductor 42, and thus reduce the increase in loss of the first reception filter 32 and the second reception filter 34.

The reception band of the first reception filter 32 is close to the reception band of the second reception filter 34 as revealed by Table 1. Thus, an LNA supporting both reception bands of the first reception filter 32 and the second reception filter 34 can be achieved. Therefore, the LNA coupled to the unified reception terminal 14 through the matching circuit 36 becomes one, and the wiring between the reception terminal 14 and the LNA becomes one. Thereby, the wiring arrangement can be less complicated. Therefore, when the filter module includes multiple reception filters, the matching circuit is preferably coupled to reception filters having adjoining reception bands in the multiple reception filters. For example, in a filter module including reception filters supporting band 1, band 2, band 5, and band 8 presented in Table 1, one matching circuit is preferably coupled to the reception filter supporting band 1 and the reception filter supporting band 2, and another matching circuit is preferably coupled to the reception filter supporting band 5 and the reception filter supporting band 8.

Figure 11:
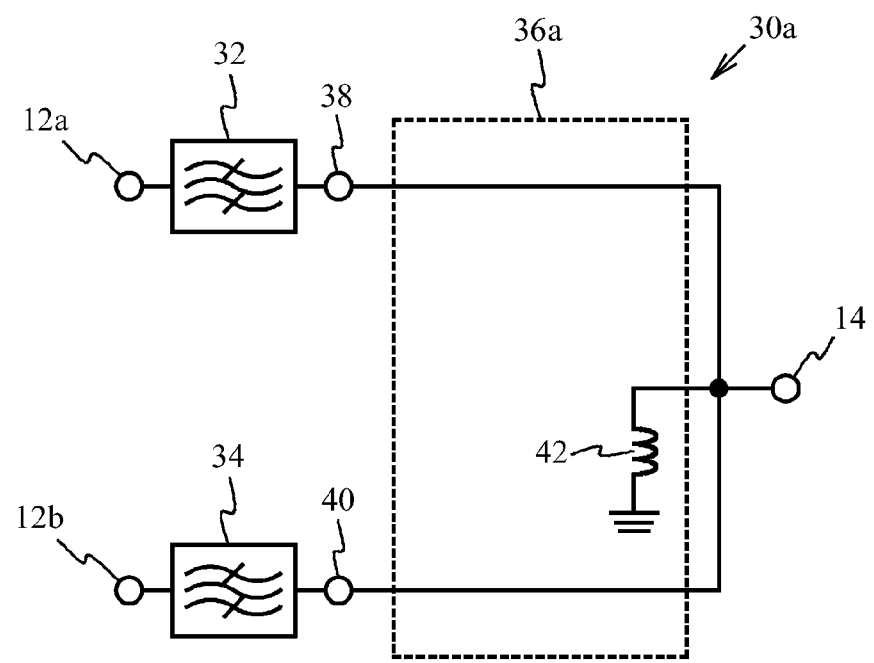
FIG. 11 is a circuit diagram illustrating a filter module in accordance with a first variation of the second embodiment.

The matching circuit is not limited to the one illustrated in FIG. 5, may have other configurations. FIG. 11 is a circuit diagram illustrating a filter module in accordance with a first variation of the second embodiment. As illustrated in FIG. 11, compared to the matching circuit 36 in the filter module 30 of the second embodiment, a matching circuit 36a in a filter module 30a of the first variation of the second embodiment is configured so that the inductors 42 at the reception terminal 14 side are combined to one, and other inductors 42 and the capacitors 44 are removed. That is to say, the matching circuit 36a is formed by one inductor 42 connected between a node, which is between the first reception filter 32 and second reception filter 34 and the reception terminal 14, and a ground. Other configurations are the same as those of the second embodiment illustrated in FIG. 5, and thus a description thereof is omitted.

As described for the filter module 30a of the first variation of the second embodiment, the matching circuit 36a may be formed by one inductor 42. Even in this case, a reception filter to be electrically coupled to the unified reception terminal 14 can be switched by the matching circuit 36a in accordance with a frequency band.

Figure 12:
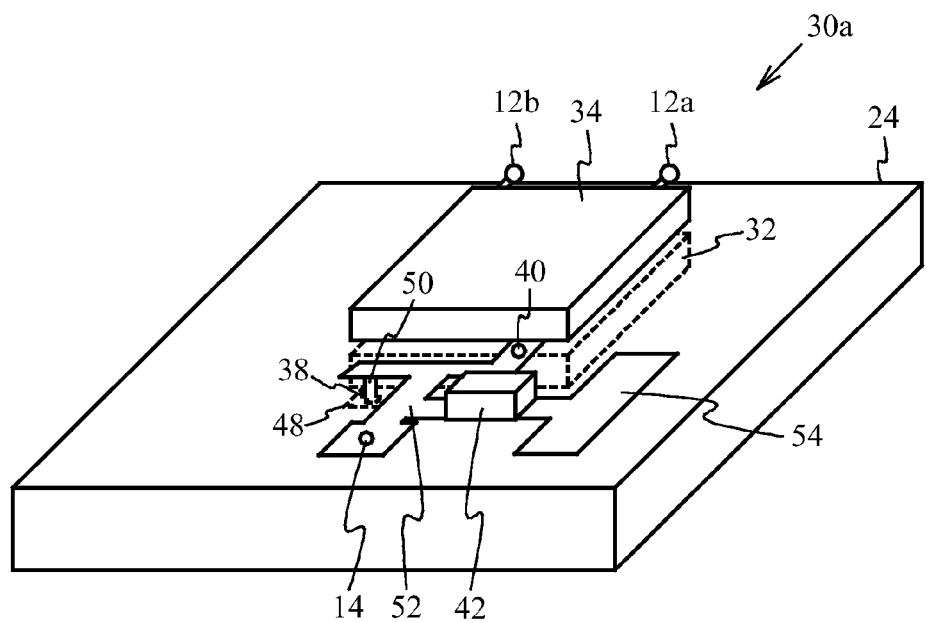
FIG. 12 is a perspective view illustrating the filter module in accordance with the first variation of the second embodiment.

FIG. 12 is a perspective view illustrating the filter module in accordance with the first variation of the second embodiment. As illustrated in FIG. 12, the first variation differs from the second embodiment illustrated in FIG. 10 in that only one inductor 42 is located as the matching circuit 36a formed on the surface of the module substrate 24. Other configurations are the same as those of the second embodiment illustrated in FIG. 12, and thus a description thereof is omitted.

The first variation of the second embodiment configures the matching circuit 36a to be formed by one inductor 42, and thus can reduce an area in which the components of the matching circuit 36a and the wirings 52 are formed as illustrated in FIG. 12, and further reduce the size of the filter module 30a.

The second embodiment designs the reception terminal 14 to have an impedance of 100Ω, but the input impedance of the LNA coupled to the reception terminal 14 may be other than 100Ω. Therefore, the matching circuit 36 may have an impedance converting function so that the LNAs can be directly coupled thereto. This configuration can eliminate the use of an impedance matching circuit in an outside between the filter module 30 and the LNA.

Third Embodiment

Figure 13:
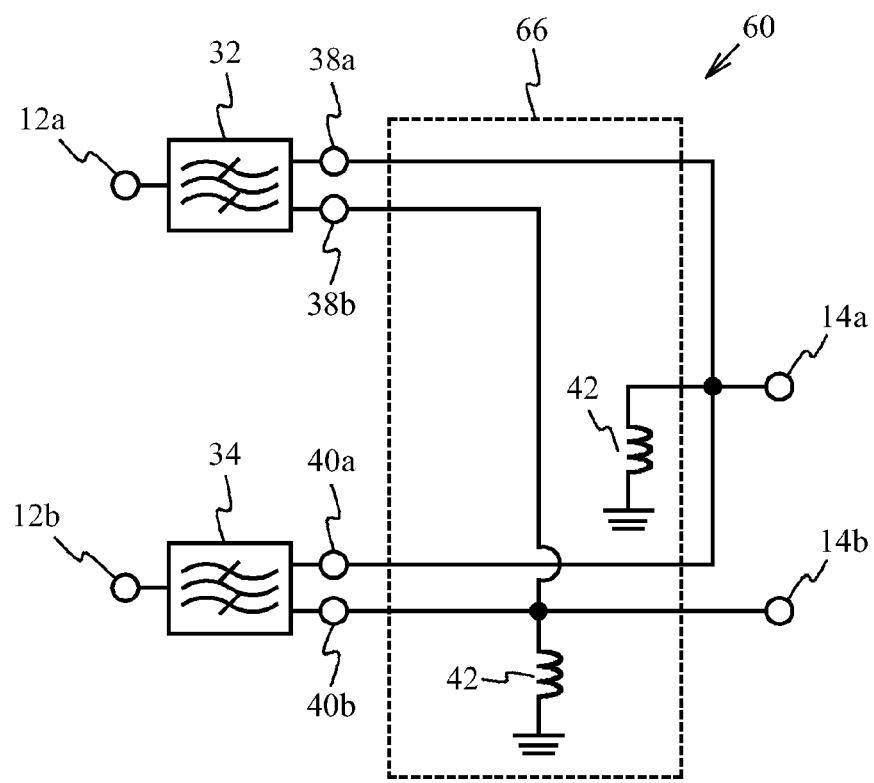
FIG. 13 is a circuit diagram illustrating a filter module in accordance with a third embodiment.

A third embodiment is an exemplary filter module using a differential filter for a reception filter. FIG. 13 is a circuit diagram illustrating a filter module in accordance with the third embodiment. As illustrated in FIG. 13, a filter module 60 of the third embodiment uses a differential filter for the first reception filter 32 and the second reception filter 34. Thus, the first reception filter 32 is coupled to a matching circuit 66 through two terminals 38a and 38b. The second reception filter 34 is coupled to the matching circuit 66 through two terminals 40a and 40b. The terminals 38a and 38b are differential terminals, and the terminals 40a and 40b are also differential terminals.

The first reception terminals (differential terminals) of the first reception filter 32 and the second reception filter 34 are unified through the matching circuit 66 to form a reception terminal 14a, and the second reception terminals thereof are unified through the matching circuit 66 to form a reception terminal 14b. The matching circuit 66 has the same function as the matching circuit 22 described in the first embodiment. The matching circuit 66 includes the inductor 42 connected between a node, which is between the terminal 38a and terminal 40a and the reception terminal 14a, and a ground, and the inductor 42 connected between a node, which is between the terminal 38b and terminal 40b and the reception terminal 14b, and a ground.

Figure 14:
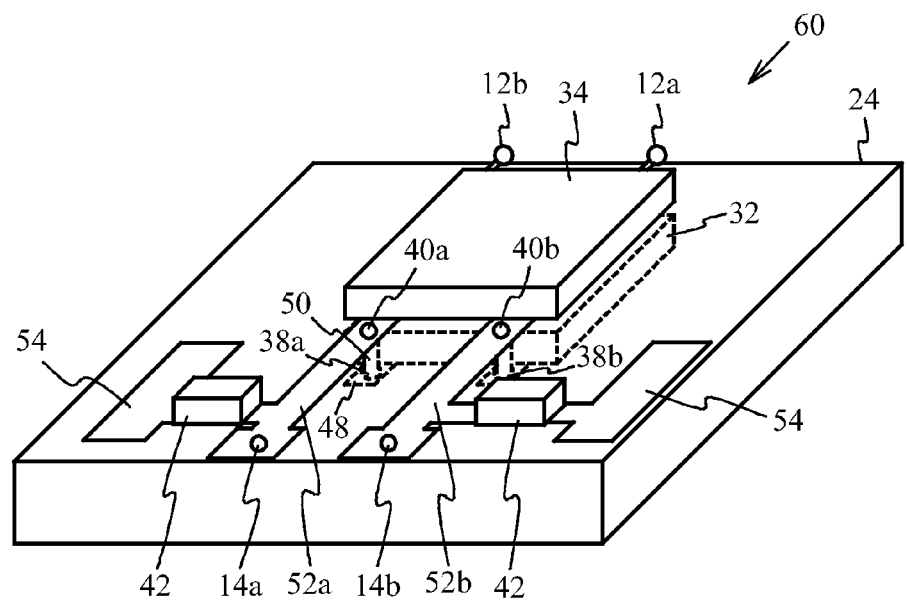
FIG. 14 is a perspective view illustrating the filter module in accordance with the third embodiment.

FIG. 14 is a perspective view illustrating the filter module of the third embodiment. As illustrated in FIG. 14, the first reception filter 32 is embedded in the module substrate 24 and the second reception filter 34 is mounted on the surface of the module substrate 24 so as to overlap the first reception filter 32 in a most part as with FIG. 10 of the second embodiment. The inductors 42 constituting the matching circuit 66 are mounted on the surface of the module substrate 24.

The terminals 38a and 38b to which the first reception filter 32 is coupled is coupled to the wirings 48 embedded in the module substrate 24. The wirings 48 are electrically coupled to wirings 52a and 52b formed on the surface of the module substrate 24 by the penetrating electrodes 50. The terminal 40a to which the second reception filter 34 is coupled is electrically coupled to the wiring 52a to which the terminal 38a is electrically coupled, and the terminal 40b is coupled to the wiring 52b to which the terminal 38b is electrically coupled. The reception terminal 14a is coupled to the wiring 52a to which the terminal 38a and the terminal 40a are electrically coupled, and the reception terminal 14b is coupled to the wiring 52b to which the terminal 38b and the terminal 40b are electrically coupled. Thereby, the first reception terminals of the first reception filter 32 and the second reception filter 34 are unified to form the reception terminal 14a, and the second reception terminals are unified to form the reception terminal 14b.

The third embodiment uses a differential filter having two reception terminals for the first reception filter 32 and the second reception filter 34. Even in this case, as illustrated in FIG. 13, the number of reception terminals can be reduced and the wiring arrangement can be less complicated by unifying two reception terminals of the first reception filter 32 and the second reception filter 34 through the matching circuit 66. Especially in a case of the differential filter, the number of reception terminals is large compared to a non-differential filter, and thus reduction in the number of reception terminals by unifying the reception terminals is effective. Moreover, as illustrated in FIG. 14, the filter module 60 can be downsized by arranging the first reception filter 32 and the second reception filter 34 so that they overlap each other.

Figure 15:
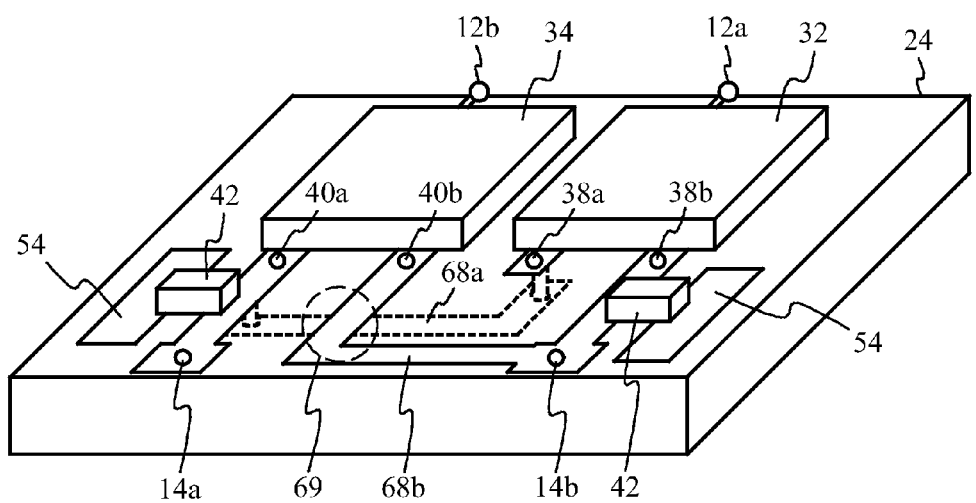
FIG. 15 is a perspective view of the first reception filter and the second reception filter mounted on a surface of a module substrate.

Here, a description will be given of a problem when both the first reception filter 32 and the second reception filter 34 are mounted on the surface of the module substrate 24. FIG. 15 is a perspective view illustrating the first reception filter 32 and the second reception filter 34 mounted on the surface of the module substrate 24. As illustrated in FIG. 15, when both the terminal 38a and the terminal 40a are coupled to a wiring 68a and both the terminal 38b and the terminal 40b are coupled to a wiring 68b, an intersecting area 69 in which the wirings 68a and 68b intersect with each other is generated. In the intersecting area 69, the wirings 68a and 68b are electromagnetically coupled to each other, and thus the characteristics of the first reception filter 32 and the second reception filter 34 degrade.

In contrast, the third embodiment configures the first reception filter 32 to be embedded in the module substrate 24, and the second reception filter 34 to be mounted on the surface of the module substrate 24 as illustrated in FIG. 14, and thus prevents the wirings 52a and 52b from intersecting with each other. Therefore, when a differential filter is used for the first reception filter 32 and the second reception filter 34, the configuration that embeds the first reception filter 32 in the module substrate 24 and mounts the second reception filter 34 on the surface of the module substrate 24 has an advantage in characteristics.

Figure 16:
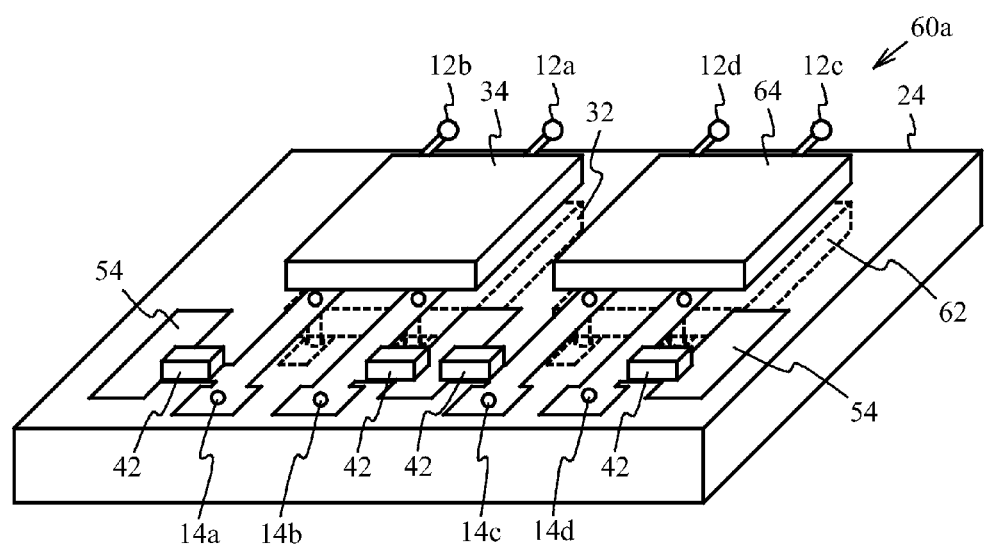
FIG. 16 is a perspective view illustrating a filter module in accordance with a first variation of the third embodiment.

FIG. 16 is a perspective view of a filter module in accordance with a first variation of the third embodiment. The third embodiment describes a filter module supporting two frequency bands (band 1 and band 2), but the first variation of the third embodiment is an exemplary filter module supporting four frequency bands (band 1, band 2, band 5, and band 8). As illustrated in FIG. 16, a filter module 60a of the first variation of the third embodiment is configured so that the first reception filter 32 supporting band 1 is embedded in the module substrate 24 and the second reception filter 34 supporting band 2 is mounted on the surface of the module substrate 24 so as to overlap the first reception filter 32. A third reception filter 62 supporting band 5 is embedded in the module substrate 24, and a fourth reception filter 64 supporting band 8 is mounted on the surface of the module substrate 24 so as to overlap the third reception filter 62.

The first reception filter 32 through the fourth reception filter 64 are coupled to the antenna terminals 12a through 12d respectively. The first and second reception terminals of the first reception filter 32 and the second reception filter 34 are unified to form the reception terminals 14a and 14b respectively. The first and second reception terminals of the third reception filter 62 and the fourth reception filter 64 are unified to form reception terminals 14c and 14d respectively. The formation of the matching circuit is the same as that of the matching circuit 36 described in FIG. 14 of the third embodiment, and thus a description is omitted.

The first variation of the third embodiment is a filter module supporting four frequency bands. Even in this case, the number of reception terminals can be reduced, and the wiring arrangement can be less complicated by unifying the first and second terminals of the first reception filter 32 and the second reception filter 34 through the matching circuit, and unifying the first and second reception terminals of the third reception filter 62 and the fourth reception filter 64 through the matching circuit. Moreover, the filter module 60a can be downsized by arranging the first reception filter 32 and the second reception filter 34 so as to overlap each other, and arranging the third reception filter 62 and the fourth reception filter 64 to overlap each other.

As with the first embodiment, the second and third embodiments can downsize the filter module if the first reception filter 32 and the second reception filter 34 overlap each other in at least a part thereof. However, to reduce the size of the filter module, preferably a half or more of areas of the first reception filter 32 and the second reception filter 34 overlap each other, more preferably three quarters or more of areas overlap each other, and further preferably all areas overlap each other. For example, a projected region of one of the first reception filter 32 and the second reception filter 34 is preferably included in a region of the other one. This applies as well to the third reception filter 62 and the fourth reception filter 64 of the first variation of the third embodiment.

Fourth Embodiment

Figure 17:
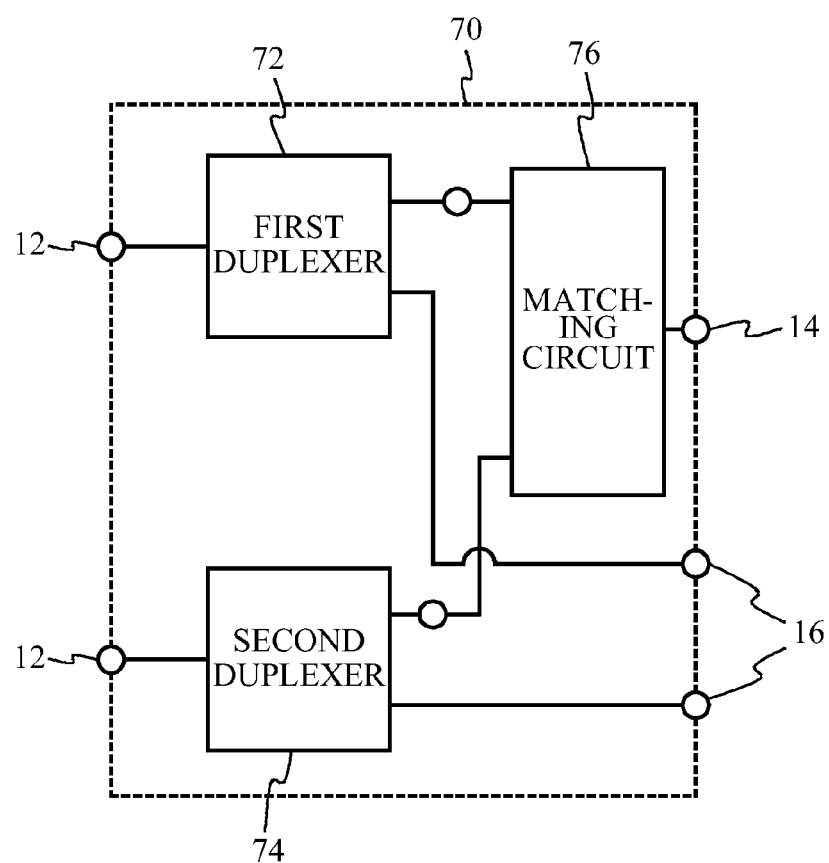
FIG. 17 is a block diagram illustrating a duplexer module in accordance with a fourth embodiment.

A fourth embodiment is an exemplary duplexer module supporting two frequency bands. FIG. 17 is a block diagram illustrating a duplexer module in accordance with the fourth embodiment. As illustrated in FIG. 17, a duplexer module 70 of the fourth embodiment includes a first duplexer 72, a second duplexer 74, and a matching circuit 76 connected between the antenna terminals 12 and the reception terminal 14 and transmission terminals 16. The first duplexer 72 is a duplexer for a first frequency band, and a transmission filter constituting the first duplexer 72 is a bandpass filter having a transmission band of the first frequency band as a passband, and a reception filter is a bandpass filter having a reception band of the first frequency band as a passband. The second duplexer 74 is a duplexer for a second frequency band different from the first frequency band, and a transmission filter constituting the second duplexer 74 is a bandpass filter having a transmission band of the second frequency band as a passband, and a reception filter is a bandpass filter having a reception band of the second frequency band as a passband. The matching circuit 76 is coupled to the reception filter constituting the first duplexer 72 and the reception filter constituting the second duplexer 74.

The first duplexer 72 and the second duplexer 74 are coupled to separate antenna terminals 12. The reception terminal of the reception filter constituting the first duplexer 72 and the reception terminal of the reception filter constituting the second duplexer 74 are unified through the matching circuit 76 to form one reception terminal 14. The transmission filter constituting the first duplexer 72 and the transmission filter constituting the second duplexer 74 are coupled to respective transmission terminals 16.

The matching circuit 76 has the same function as the matching circuit 22 described in the first embodiment. That is to say, the matching circuit 76 matches an impedance of the reception filter of the first duplexer 72 with an impedance of the reception terminal 14 and significantly increases an impedance of the reception filter of the second duplexer 74 at the reception terminal 14 in the first frequency band. Moreover, the matching circuit 76 significantly increases an impedance of the reception filter of the first duplexer 72 at the reception terminal 14 and matches an impedance of the reception filter of the second duplexer 74 with an impedance of the reception terminal 14 in the second frequency band. Thereby, a reception filter to be electrically coupled to the unified reception terminal 14 can be switched between the first duplexer 72 and the second duplexer 74.

Figure 18:
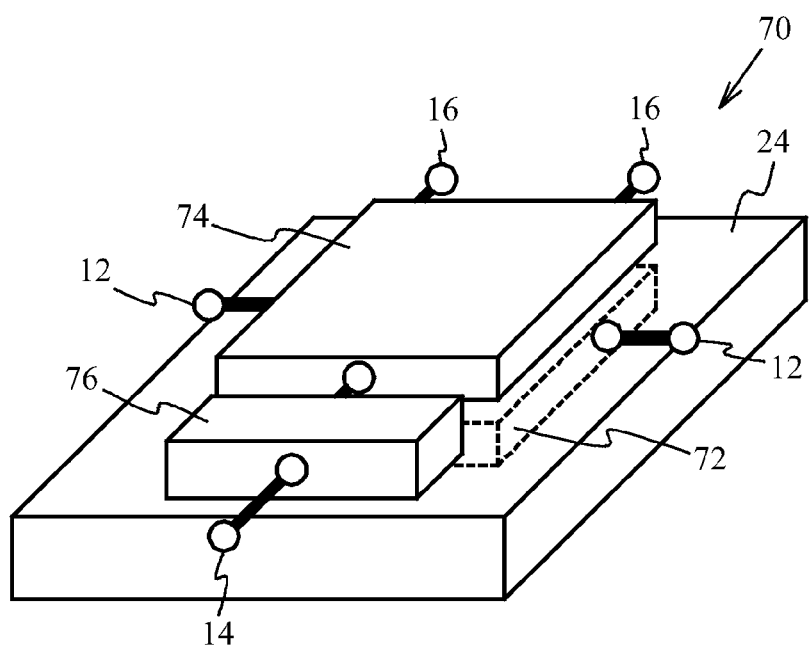
FIG. 18 is a perspective view illustrating the duplexer module in accordance with the fourth embodiment.

FIG. 18 is a perspective view illustrating a duplexer module in accordance with the fourth embodiment. As illustrated in FIG. 18, the duplexer module 70 of the fourth embodiment is configured so that the first duplexer 72 is embedded in the module substrate 24 and the second duplexer 74 is mounted on the surface of the module substrate 24. The first duplexer 72 and the second duplexer 74 are located so as to overlap each other. The first duplexer 72 and the second duplexer 74 are wafer level packages including a sealing portion that is formed on a substrate including an electrode exciting an acoustic wave formed therein to seal the electrode exciting the acoustic wave, or packages including a sealing portion that is formed on a wiring substrate in which a substrate with an electrode exciting an acoustic wave formed therein is installed to seal the substrate. The matching circuit 76 is located on the surface of the module substrate 24.

The duplexer module 70 of the fourth embodiment includes the first duplexer 72 for the first frequency band, the second duplexer 74 for the second frequency band, and the matching circuit 76 that is coupled to the reception filter of the first duplexer 72 and the reception filter of the second duplexer 74 and makes one of the first frequency band and the second frequency band suppressed when passing signals in the other one. This configuration allows the matching circuit 76 to switch a reception filter to be electrically coupled to the reception terminal 14 in accordance with the frequency band, and the reception terminals of the first duplexer 72 and the second duplexer 74 to be unified through the matching circuit 76. Thereby, the number of reception terminals can be reduced without reducing the number of frequency bands to be supported, and the wiring arrangement can be less complicated. Moreover, the first duplexer 72 is embedded in the module substrate 24 and the second duplexer 74 is mounted on the surface of the module substrate 24 so that the first duplexer 72 and the second duplexer 74 are located so as to overlap each other. Thereby, the duplexer module 70 can be downsized.

The duplexer module 70 can be downsized if the first duplexer 72 and the second duplexer 74 are arranged so as to overlap each other in at least a part thereof. However, to reduce the size of the duplexer module 70, preferably a half or more of areas of the first duplexer 72 and the second duplexer 74 overlap each other, more preferably three quarters or more of areas overlap each other, and further preferably all areas overlap each other. For example, a projected region of one of the first duplexer 72 and the second duplexer 74 is preferably included in a region of the other one.

FIG. 14 of Japanese Patent Application Publication No. 2000-349586 discloses a configuration that unifies reception terminals in a module including two duplexers. However, the statement in paragraph 0071 reveals that the configuration is for a case two reception bands overlap each other and does not support multiple frequency bands. In addition, FIG. 21 and FIG. 22 disclose diagrams in which reception terminals of reception filters are unified. However, the statement in paragraph 0083 reveals that two reception filters are merely connected in parallel and multiple frequency bands are not supported.

Fifth Embodiment

Figure 19:
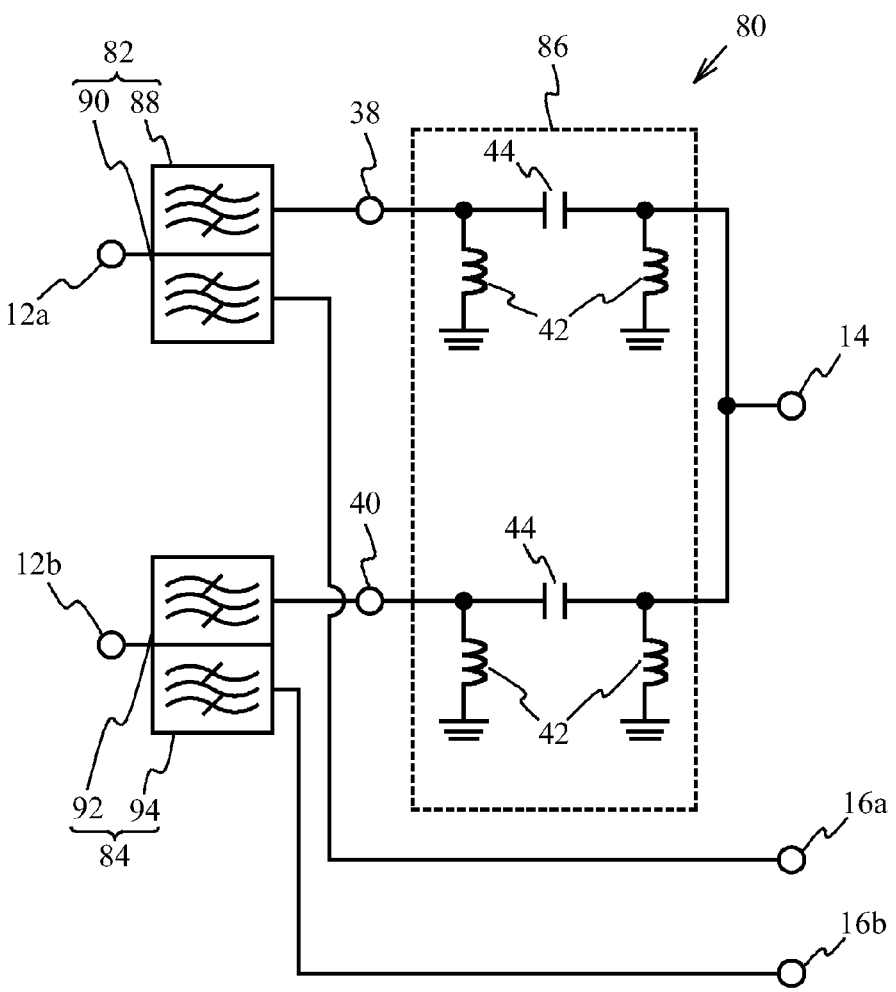
FIG. 19 is a circuit diagram illustrating a duplexer module in accordance with a fifth embodiment.

A fifth embodiment is an exemplary duplexer module including a duplexer supporting band 1 of W-CDMA and a duplexer supporting band 2. FIG. 19 is a circuit diagram illustrating a duplexer module in accordance with the fifth embodiment. As illustrated in FIG. 19, a duplexer module 80 of the fifth embodiment includes a first duplexer 82 supporting band 1, a second duplexer 84 supporting band 2, and a matching circuit 86. The first duplexer 82 is coupled to the antenna terminal 12a for band 1, and the second duplexer 84 is coupled to the antenna terminal 12b for band 2.

The first duplexer 82 includes a first reception filter 88 and a first transmission filter 90. The second duplexer 84 includes a second reception filter 92 and a second transmission filter 94. The first reception filter 88 and the second reception filter 92 are coupled to the matching circuit 86 through the terminals 38 and 40 respectively, and reception terminals of the reception filters are unified through the matching circuit 86 to form one reception terminal 14. The matching circuit 86 has the same function as the matching circuit 76 described in the fourth embodiment. The first transmission filter 90 and the second transmission filter 94 are coupled to transmission terminals 16a and 16b respectively. The matching circuit 86 has the same configuration as that of the matching circuit 36 described in FIG. 5 of the second embodiment, and thus a description thereof is omitted.

Figure 20:
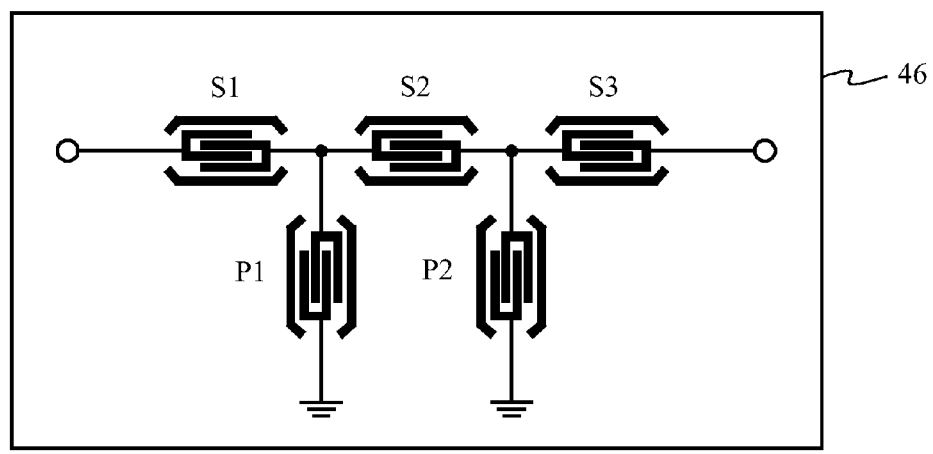
FIG. 20 is a plan view illustrating a first transmission filter and a second transmission filter.

FIG. 20 is a plan view illustrating the first transmission filter 90 and the second transmission filter 94. As illustrated in FIG. 20, the first transmission filter 90 and the second transmission filter 94 are ladder-type surface acoustic wave filters, each including series resonators S1 through S3 connected in series between an input and an output and parallel resonators P1 and P2 connected in parallel. The series resonators S1 through S3 and the parallel resonators P1 and P2 are located on the piezoelectric substrate 46 such as a LT substrate or LN substrate.

The first reception filter 88 and the second reception filter 92 are double mode coupling type surface acoustic wave filters, and have the same configuration as that illustrated in FIG. 6A and FIG. 6B of the second embodiment, and thus a description is omitted.

The fifth embodiment designs the antenna terminals 12a and 12b to have an impedance of 50Ω, the reception terminal 14 to have an impedance of 100Ω, and the transmission terminals 16a and 16b to have an impedance of 50Ω as with the second embodiment. The inductors 42 constituting the matching circuit 86 is designed to have the inductance and the Q-value described in FIG. 5 of the second embodiment, and the capacitor 44 is designed to have the capacitance and the Q-value described in FIG. 5.

Figure 21:
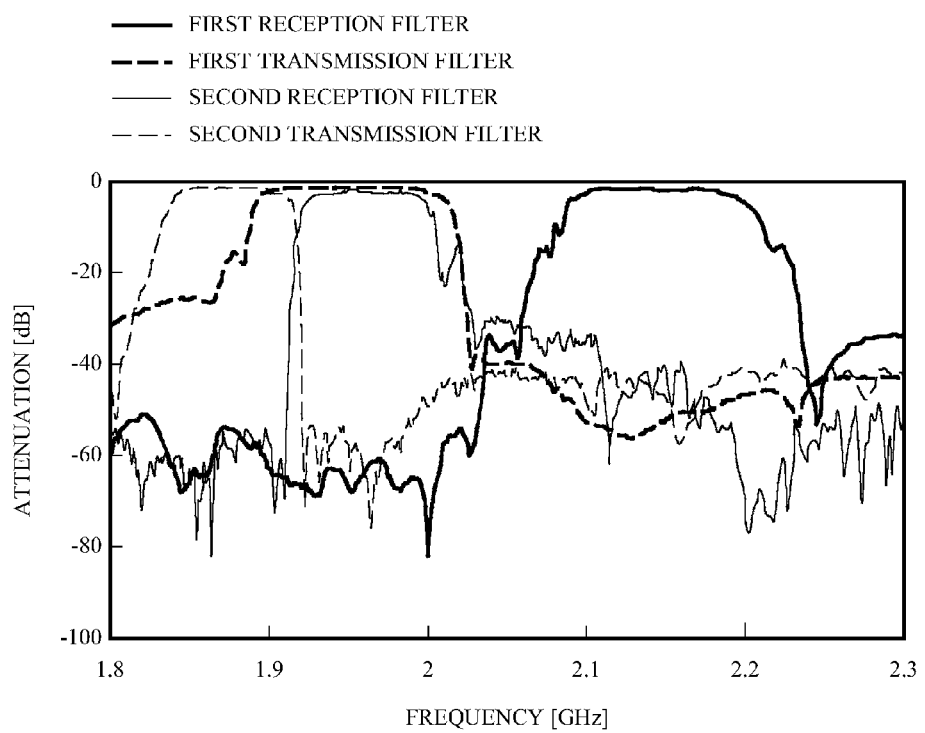
FIG. 21 is a diagram illustrating pass characteristics of the duplexer module in accordance with the fifth embodiment.

FIG. 21 is a diagram illustrating a pass characteristic of the duplexer module of the fifth embodiment. In FIG. 21, a bold solid line indicates a pass characteristic of the first reception filter 88 of the first duplexer 82, and a bold dashed line indicates a pass characteristic of the first transmission filter 90. A thin solid line indicates a pass characteristic of the second reception filter 92 of the second duplexer 84, and a thin dashed line indicates a pass characteristic of the second transmission filter 94. As illustrated in FIG. 21, both the first duplexer 82 and the second duplexer 84 exhibit good pass characteristics.

Figure 22:
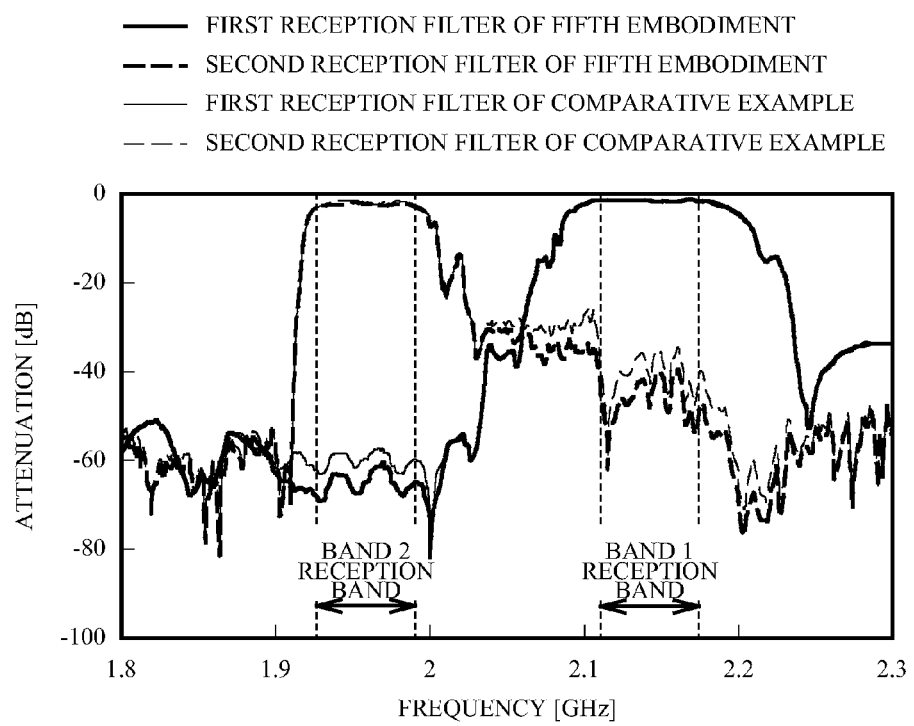
FIG. 22 is a diagram illustrating pass characteristics of the first reception filter and the second reception filter of the duplexer module in accordance with the fifth embodiment.

FIG. 22 is a diagram illustrating pass characteristics of the first reception filter 88 and the second reception filter 92 in the duplexer module of the fifth embodiment. In FIG. 22, a bold solid line indicates a pass characteristic of the first reception filter 88 of the fifth embodiment, and a bold dashed line indicates a pass characteristic of the second reception filter 92. In addition, as a comparative example, a thin solid line indicates a pass characteristic of the first reception filter 88 and a thin dashed line indicates a pass characteristic of the second reception filter 92 when the first duplexer 82 and the second duplexer 84 are separately measured alone. The first duplexer 82 and the second duplexer 84 are separately measured alone by the same method described in FIG. 8 of the second embodiment. As illustrated in FIG. 22, the first reception filter 88 and the second reception filter 92 of the fifth embodiment exhibit good filter characteristics same as those of the comparative example that separately measures the first duplexer 82 and the second duplexer 84 alone. In addition, the attenuation in the suppression range is improved in the first reception filter 88 and the second reception filter 92 of the fifth embodiment compared to that of the comparative example. As described above, even in a case of the duplexer module, the attenuation in the suppression range can be improved by unifying the reception terminals through the matching circuit.

Figure 23:
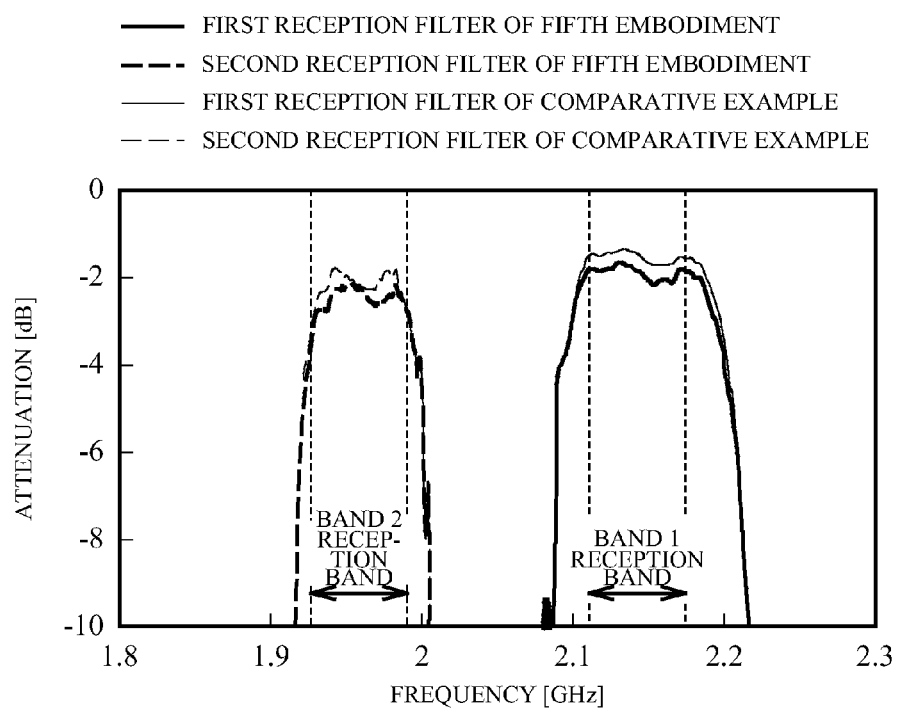
FIG. 23 is an enlarged view around reception bands in FIG. 22.

FIG. 23 is an enlarged view around the reception bands in FIG. 22. As illustrated in FIG. 23, the insertion loss increases by 0.3 dB in the first reception filter 88 and the second reception filter 92 of the fifth embodiment compared to that of the comparative example. As described in the second embodiment, this increase can be improved because it depends on the Q-value of the matching circuit 86, and the increase in loss can be canceled out by designing a filter to preliminarily have low attenuation and low-loss.

Figure 24:
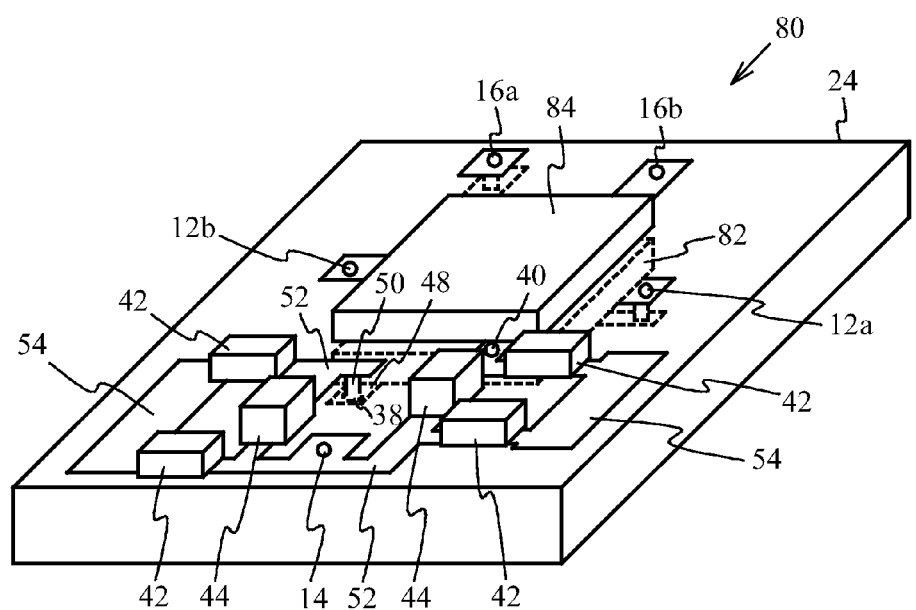
FIG. 24 is a perspective view illustrating the duplexer module in accordance with the fifth embodiment.

FIG. 24 is a perspective view illustrating the duplexer module of the fifth embodiment. As illustrated in FIG. 24, the duplexer module 80 of the fifth embodiment is configured so that the first duplexer 82 is embedded in the module substrate 24 and the second duplexer 84 is mounted on the surface of the module substrate 24 so as to overlap the first duplexer in a most part. The first duplexer 82 and the second duplexer 84 are wafer level packages including a sealing portion that is formed on a substrate including an electrode exciting an acoustic wave formed therein to seal the electrode exciting the acoustic wave, or packages including a sealing portion that is formed on a wiring substrate in which a substrate with an electrode exciting an acoustic wave formed therein is installed to seal the substrate. The inductors 42 and the capacitors 44 constituting the matching circuit 86 are mounted on the surface of the module substrate 24. The formation of the matching circuit 86 is the same as that of the matching circuit 36 described in FIG. 10 of the second embodiment, and thus a description thereof is omitted.

Figure 25A:
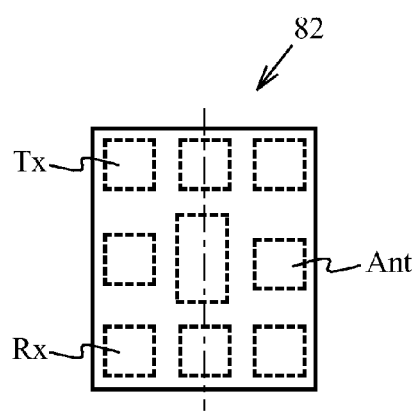
FIG. 25A is a plan view illustrating foot pads by transparently illustrating a first duplexer from above.
Figure 25B:
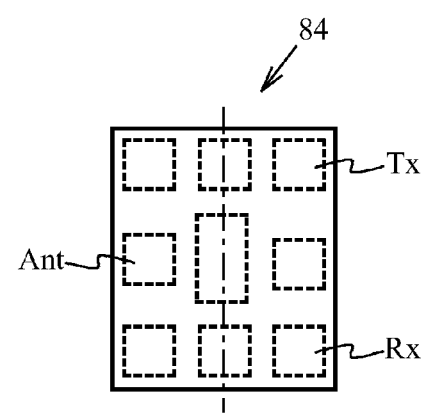
FIG. 25B is a plan view illustrating foot pads by transparently illustrating a second duplexer from above.

FIG. 25A is a plan view illustrating foot pads by transparently illustrating the first duplexer 82 from above, and FIG. 25B is a plan view illustrating foot pads by transparently illustrating the second duplexer 84 from above. The foot pads are formed on lowermost surfaces of the packages of the first duplexer 82 and the second duplexer 84, and are terminals for electrically and mechanically fixing the packages to a mounting surface of the module substrate 24. As illustrated in FIG. 25A and FIG. 25B, an antenna foot pad Ant coupled to the antenna terminal, a transmission foot pad Tx coupled to the transmission terminal, and a reception foot pad Rx coupled to the reception terminal in the first duplexer 82 are in the mirror inversion relationship to those in the second duplexer 84. That is to say, when the antenna foot pad Ant is located in a center area of a right half with respect to a center line of the first duplexer 82 with a rectangular shape, the transmission foot pad Tx is located at a first end side of a left half, and the reception foot pad Rx is located at a second end side of the left half, the antenna foot pad Ant is located in a center area of a left half with respect to a center line of the second duplexer 84 with a rectangular shape, the transmission foot pad Tx is located at a first end side of a right half, and the reception foot pad Rx is located at the second end side of the right half. Foot pads other than the antenna foot pad Ant, the transmission foot pad Tx, and the reception foot pad Rx are ground foot pads Gnd coupled to a ground.

The foot pads located in the positions illustrated in FIG. 25A and FIG. 25B cause the antenna terminal 12a to which the first duplexer 82 is coupled to be located at the opposite side to the antenna terminal 12b to which the second duplexer 84 is coupled across the first duplexer 82 and the second duplexer 84 as illustrated in FIG. 24. Moreover, the transmission terminal 16a to which the first duplexer 82 is coupled is located closer to the antenna terminal 12b than the antenna terminal 12a, and the transmission terminal 16b to which the second duplexer 84 is coupled is located closer to the antenna terminal 12a than the antenna terminal 12b. Thereby, the space between the antenna terminal 12a and the transmission terminal 16a, the space between the antenna terminal 12b and the transmission terminal 16b, and the space between the antenna terminal 12a and the antenna terminal 12b can be made wide. Therefore, the electromagnetic interference can be suppressed, and thus, the first duplexer 82 and the second duplexer 84 can be prevented from degrading in isolation characteristics.

As described above, to suppress the degradation in isolation characteristics, the first duplexer 82 and the second duplexer 84 are preferably configured so that the antenna foot pad Ant and the transmission foot pad Tx are located at opposing sides, and the antenna foot pad Ant of the first duplexer 82 is located at the opposite side to the antenna foot pad Ant of the second duplexer 84 with respect to a center line of the area in which the first duplexer 82 and the second duplexer 84 overlap each other.

The fifth embodiment configures the reception terminal of the first reception filter 88 in the first duplexer 82 and the reception terminal of the second reception filter 92 in the second duplexer 84 to be unified through the matching circuit 86 to form one reception terminal 14 as illustrated in FIG. 19. Thereby, the number of reception terminals can be reduced without reducing the number of frequency bands to be supported, and the wiring arrangement can be less complicated. Moreover, as described in FIG. 22, the attenuation in the suppression ranges of the first reception filter 88 and the second reception filter 92 can be improved. Further, as illustrated in FIG. 24, the first duplexer 82 is embedded in the module substrate 24, and the second duplexer 84 are mounted on the surface of the module substrate 24 so that the first duplexer 82 and the second duplexer 84 overlap each other. Thereby, the duplexer module 80 can be downsized.

Any of the first duplexer 82 and the second duplexer 84 may be embedded in the module substrate 24, but the first duplexer 82 is preferably embedded as illustrated in FIG. 24. The reason is the following. That is, as revealed in Table 1, band 2 supported by the second duplexer 84 has a narrow frequency interval (guard band) between the transmission band and the reception band compared to band 1 supported by the first duplexer 82. When the guard band is narrow, the transmission filter and the reception filter are required to have a steep pass characteristic in the guard band, and thus the insertion loss increases. Therefore, the second reception filter 92 and the second transmission filter 94 in the second duplexer 84 have a loss greater than that of the first reception filter 88 and the first transmission filter 90 in the first duplexer 82. A low-loss duplexer module can be obtained by embedding the first duplexer 82 originally having better loss in the module substrate 24 because characteristics degradation such as an increase in loss occurs in the duplexer embedded in the module substrate. As described above, to reduce the loss, the frequency interval between the transmission band and the reception band of the duplexer embedded in the module substrate is preferably wider than the frequency interval between the transmission band and the reception band of the duplexer mounted on the surface of the module substrate. For similar reasons, even in a case of the filter modules of the first through third embodiments, the reception filter with a wider frequency interval between the transmission band and the reception band of the supported frequency band is preferably embedded in the module substrate.

Sixth Embodiment

Figure 26:
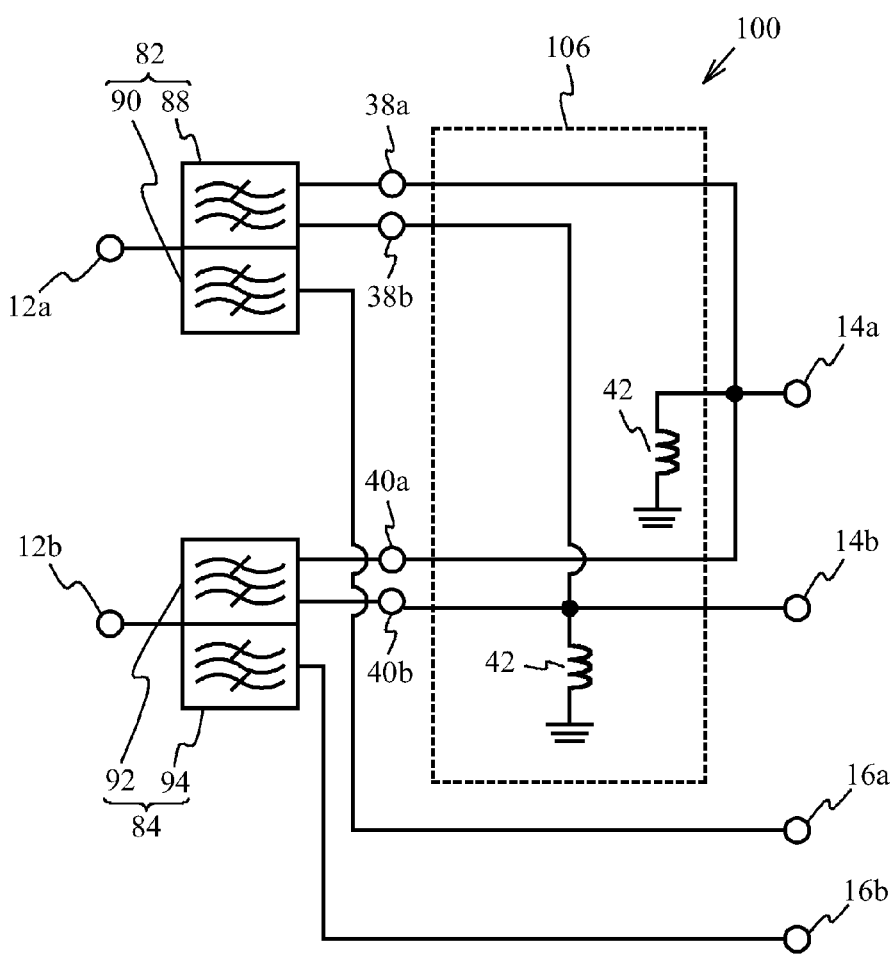
FIG. 26 is a circuit diagram illustrating a duplexer module in accordance with a sixth embodiment.

A sixth embodiment is an exemplary duplexer module using a differential filter for a reception filter. FIG. 26 is a circuit diagram illustrating a duplexer module in accordance with the sixth embodiment. As illustrated in FIG. 26, a duplexer module 100 of the sixth embodiment uses a differential filter for the first reception filter 88 of the first duplexer 82 and the second reception filter 92 of the second duplexer 84. Thus, the first reception filter 88 is coupled to a matching circuit 106 through two terminals 38a and 38b. The second reception filter 92 is coupled to the matching circuit 106 through two terminals 40a and 40b. The terminals 38a and 38b are differential terminals, and the terminals 40a and 40b are also differential terminals.

The first reception terminals (differential terminals) of the first reception filter 88 and the second reception filter 92 are unified through the matching circuit 106 to form the reception terminal 14a, and the second reception terminals are unified to form the reception terminal 14b. The matching circuit 106 has the same function as the matching circuit 76 described in the fourth embodiment. The matching circuit 106 has the same configuration of that of the matching circuit 66 described in FIG. 13 of the third embodiment, and thus a description thereof is omitted.

Figure 27:
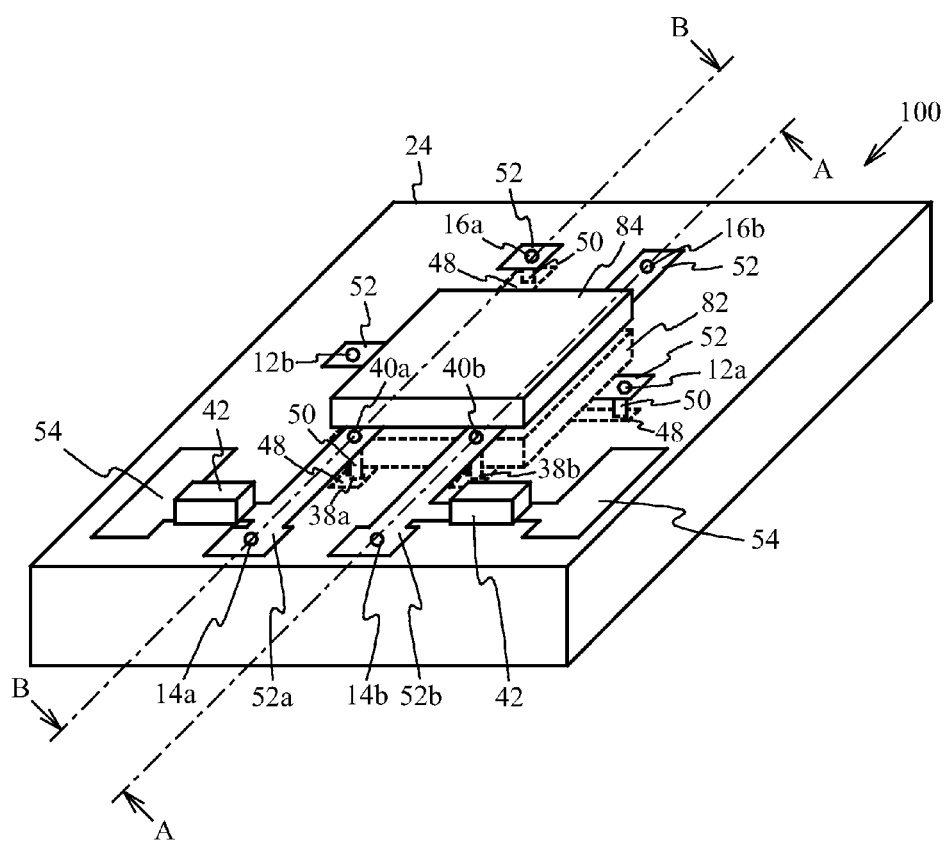
FIG. 27 is a perspective view illustrating the duplexer module in accordance with the sixth embodiment.
Figure 28A:
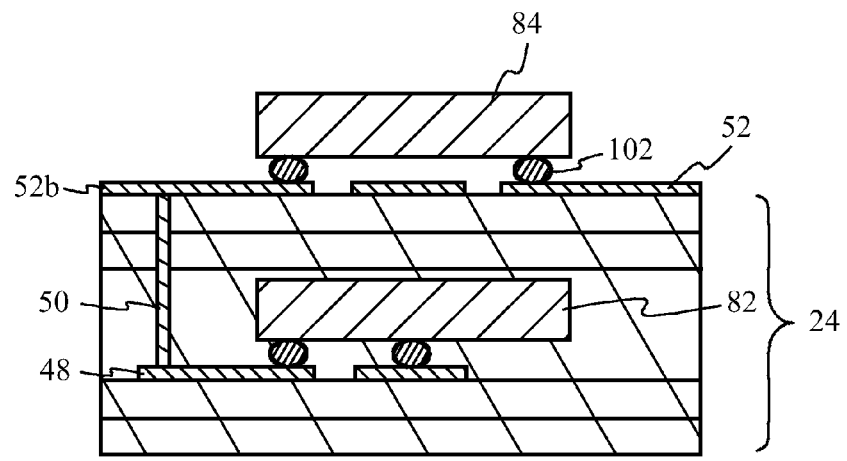
FIG. 28A is a cross-sectional view taken along line A-A in FIG. 27.
Figure 28B:
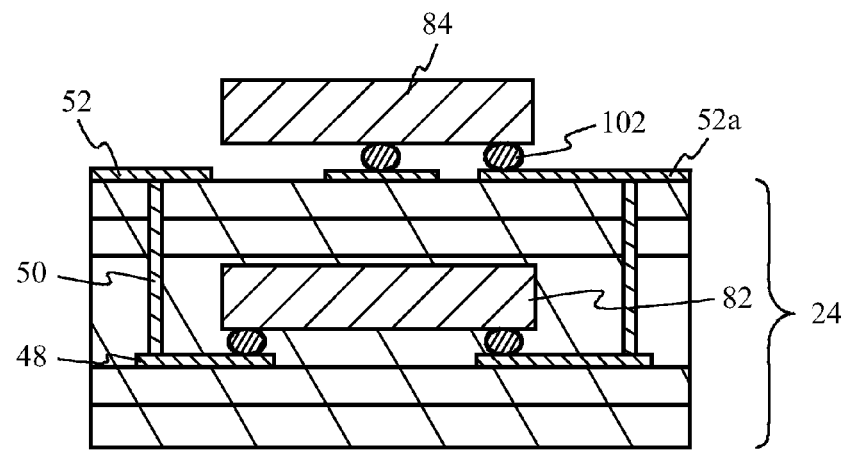
FIG. 28B is a cross-sectional view taken along line B-B in FIG. 27.

FIG. 27 is a perspective view illustrating the duplexer module in accordance with the sixth embodiment. FIG. 28A is a cross-sectional view taken along line A-A in FIG. 27, and FIG. 28B is a cross-sectional view taken along line B-B in FIG. 27. As illustrated in FIG. 27 through FIG. 28B, the duplexer module 100 of the sixth embodiment is configured so that the first duplexer 82 is embedded in the module substrate 24 and the second duplexer 84 is mounted on the surface of the module substrate 24 to overlap the first duplexer 82 in a most part as with FIG. 24 of the fifth embodiment. The inductor 42 constituting the matching circuit 106 is mounted on the surface of the module substrate 24. The formation of the matching circuit 106 is the same as the formation of the matching circuit 66 described in FIG. 14 of the third embodiment, and thus a description thereof is omitted.

The first duplexer 82 and the second duplexer 84 are flip-chip mounted on the module substrate 24 by bumps 102. The first duplexer 82 may be face-down flip-chip mounted, or may be face-up mounted. The first duplexer 82 is coupled to the wirings 48 embedded in the module substrate 24 by the bumps 102, and is electrically coupled to the wirings 52a and 52b formed on the surface of the module substrate 24 through the penetrating electrodes 50. The second duplexer 84 is coupled to the wirings 52a and 52b by the bumps 102. Thereby, the first reception terminals of the first duplexer 82 and the second duplexer 84 are unified to form the reception terminal 14a, and the second reception terminals are also unified to form the reception terminal 14b. Moreover, the first duplexer 82 is electrically coupled to the antenna terminal 12a and the transmission terminal 16a through the bumps 102, the wirings 48 embedded in the module substrate 24, the penetrating electrodes 50, and the wiring 52 formed on the surface of the module substrate 24. The second duplexer 84 is coupled to the antenna terminal 12b and the transmission terminal 16b through the bumps 102 and the wiring 52 formed on the surface of the module substrate 24.

The sixth embodiment uses a differential filter including two reception terminals for the first reception filter 88 of the first duplexer 82 and the second reception filter 92 of the second duplexer 84. Even in this case, as illustrated in FIG. 26, the number of reception terminals can be reduced without reducing the number of frequency bands to be supported by unifying the first and second reception terminals of the first reception filter 88 and the second reception filter 92 through the matching circuit 106, and thus the wire arrangement can be less complicated. As illustrated in FIG. 27 through FIG. 28B, the duplexer module 100 can be downsized by arranging the first duplexer 82 and the second duplexer 84 to overlap each other.

As with the fourth embodiment, the fifth and sixth embodiments can reduce the size of the duplexer module if the first duplexer 82 and the second duplexer 84 are arranged so as to overlap each other in at least parts thereof. However, to reduce the size of the duplexer module, preferably a half or more of areas of the first duplexer 82 and the second duplexer 84 overlap each other, more preferably three quarters or more of areas overlap each other, and further all areas overlap each other. For example, a projected region of one of the first duplexer 82 and the second duplexer 84 is preferably included in a region of the other one.

The first through sixth embodiments use surface acoustic wave filters for the first reception filter, the second reception filter, the first transmission filter, and the second transmission filter, but do not intend to suggest any limitation, and may use a Love wave filter or a boundary acoustic wave filter. A Love wave filter is a filter that includes a dielectric film such as a silicon oxide film located on the piezoelectric substrate 46 so as to cover the IDT0 and the reflectors R0 in FIG. 6B. A boundary acoustic wave filter is a filter formed by stacking a first dielectric film covering the IDT0 and the reflectors R0 and a second dielectric film with an acoustic velocity faster than that in the first dielectric film in this order from a bottom side.

Figure 29A:
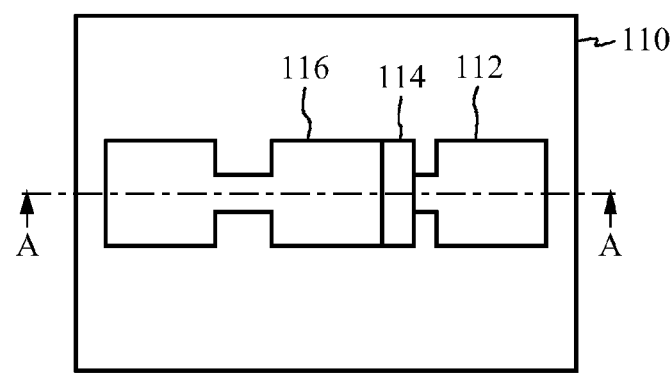
FIG. 29A is a plan view of a piezoelectric thin film resonator.
Figure 29B:
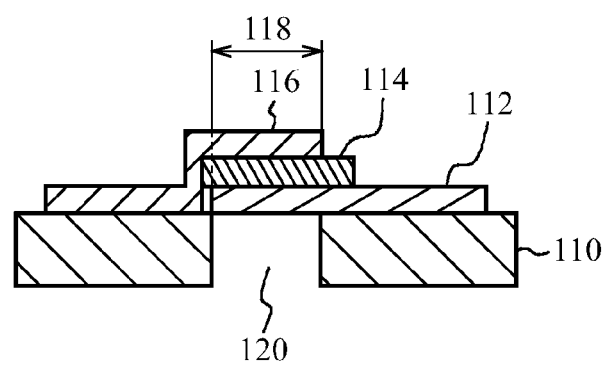
FIG. 29B is a cross-sectional view taken along line A-A in FIG. 29A.

A filter using a piezoelectric thin film resonator may be used for the first reception filter, the second reception filter, the first transmission filter, and the second transmission filter. FIG. 29A is a plan view of a piezoelectric thin film resonator, and FIG. 29B is a cross-sectional view taken along line A-A in FIG. 29A. As illustrated in FIG. 29A and FIG. 29B, the piezoelectric thin film resonator is formed by staking a lower electrode 112, a piezoelectric film 114 such as aluminum nitride, and an upper electrode 116 on a substrate 110 such as silicon in this order from the substrate side. A resonance region 118 is a region in which the lower electrode 112 and the upper electrode 116 overlap each other across the piezoelectric film 114. A penetration hole 120 piercing the substrate 110 is formed in the substrate 110 below the resonance region 118. In stead of the penetration hole 120, an air-space may be formed by removing a part of the substrate 110, a dome-shaped air-space may be formed between the substrate 110 and the lower electrode 112, or an acoustic multilayer film that reflects an acoustic wave may be formed.

Filters other than the acoustic wave filter may be used for the first reception filter, the second reception filter, the first transmission filter, and the second transmission filter, but the acoustic wave filter is preferably used to reduce the cost and size and obtain good characteristics.

The first through third embodiments describe filter modules supporting two frequency bands or four frequency bands. Moreover, the fourth through sixth embodiments describe duplexer modules supporting two frequency bands. However, the modules may support other frequency bands (e.g. frequency bands other than band 1, band 2, band 5, and band 8). In this case, the matching circuit is coupled to at least two reception filters (or duplexers) out of multiple reception filters (or duplexers), and has a function that makes a reception band of one of the coupled reception filters suppressed when passing signals in a reception band of the other one. Further, at least one reception filter (or duplexer) of the at least two reception filters (or duplexers) to which the matching circuit is coupled is embedded in the module substrate, and at least another one reception filter (or duplexer) of other reception filters is mounted on the surface of the module substrate so as to overlap the embedded reception filter (or duplexer).

Although the embodiments of the present invention have been described in detail, it is to be understood that the various change, substitutions, and alterations could be made hereto without departing from the spirit and scope of the invention.

What is claimed is:

1. A filter module comprising:
  reception filters connected between an antenna terminal and a reception terminal, the reception filters filtering a receive signal from the antenna terminal and outputting the filtered receive signal to the reception terminal; and a module substrate, wherein a first reception filter that is at least one reception filter of the reception filters is embedded in the module substrate, and a second reception filter that is at least another one reception filter is mounted on a surface of the module substrate so as to overlap the first reception filter.

2. The filter module according to claim 1, wherein the reception filters have reception bands different from each other, the filter module further comprises a passive circuit that is coupled to the first and second reception filters, that is coupled between the first and second reception filters and the reception terminal, and that makes a reception band of one of the first and second reception filters suppressed when passing signals in a reception band of another of the first and second reception filters, and the reception terminals of the first and second reception filters are unified through the passive circuit to form a unified reception terminal.

3. The filter module according to claim 2, wherein the passive circuit includes an inductor coupled between a node and a ground, the node being between the first and second reception filters and the unified reception terminal, and the inductor is located on the surface of the module substrate on which the second reception filter is mounted.

4. The filter module according to claim 1, wherein the reception filters are differential filters, each including two reception terminals.

5. The filter module according to claim 1, wherein the reception filters are acoustic wave filters.

6. A duplexer module comprising:

duplexers, each including a reception filter connected between an antenna terminal and a reception terminal and a transmission filter connected between the antenna terminal and a transmission terminal, the reception filter filtering a receive signal from the antenna terminal and outputting the filtered receive signal to the reception terminal, the transmission filter filtering a transmit signal from the transmission terminal and outputting the filtered transmit signal to the antenna terminal; and a module substrate, wherein a first duplexer that is at least one duplexer of the duplexers and that includes the reception filter and the transmission filter is embedded in the module substrate, and a second duplexer that is at least another one duplexer and that includes the reception filter and the transmission filter is mounted on a surface of the module substrate so as to overlap the first duplexer.

7. The duplexer module according to claim 6, wherein the duplexers have reception bands different from each other and transmission bands different from each other, the duplexer module further comprises a passive circuit that is coupled to the reception filters of the first and second duplexers, that is coupled between the reception filters of the first and second duplexers and the reception terminal, and that makes a reception band of one of the first and second duplexers suppressed when passing signals in a reception band of another of the first and second duplexers, and the reception terminals of the first and second duplexers are unified through the passive circuit to form a unified reception terminal.

8. The duplexer module according to claim 7, wherein the passive circuit includes an inductor connected between a node and a ground, the node being between the first and second duplexers and the unified reception terminal, and the inductor is located on the surface of the module substrate on which the second duplexer is mounted.

9. The duplexer module according to claim 6, wherein each of the duplexers includes a first foot pad coupled to the antenna terminal and a second foot pad coupled to the transmission terminal, the first foot pad and the second foot pad are located at sides opposing each other, and the first foot pad of the first duplexer is located at a side opposite to a side at which the first foot pad of the second duplexer is located with respect to a center line of an area in which the first duplexer and the second duplexer overlap each other.

10. The duplexer module according to claim 6, wherein a frequency interval between a transmission band and a reception band of the first duplexer is wider than a frequency interval between a transmission band and a reception band of the second duplexer.

11. The duplexer module according to claim 6, wherein the reception filters of the duplexers are differential filters, each including two reception terminals.

12. The duplexer module according to claim 6, wherein the reception filters and the transmission filters of the duplexers are acoustic wave filters.

* * * * *